United States Patent [19]
Chao

[11] Patent Number: 5,817,565
[45] Date of Patent: Oct. 6, 1998

[54] METHOD OF FABRICATING A SEMICONDUCTOR MEMORY CELL HAVING A TREE-TYPE CAPACITOR

[75] Inventor: Fang-Ching Chao, Hsinchu, Taiwan

[73] Assignee: United Microelectronics Corp., Hsinchu, Taiwan

[21] Appl. No.: 757,672

[22] Filed: Nov. 29, 1996

[30] Foreign Application Priority Data

Aug. 16, 1996 [TW] Taiwan .................................. 85109994

[51] Int. Cl.⁶ .................................................. H01L 29/68
[52] U.S. Cl. ............................................ 438/396; 438/386
[58] Field of Search .................................... 438/396, 397, 438/398, 399, 394; 257/68, 71, 303, 306, 308

[56] References Cited

U.S. PATENT DOCUMENTS

| | | |
|---|---|---|
| 5,071,783 | 12/1991 | Taguchi et al. . |
| 5,077,688 | 12/1991 | Kumanoya et al. . |
| 5,089,869 | 2/1992 | Matsuo et al. . |
| 5,102,820 | 4/1992 | Chiba . |
| 5,126,810 | 6/1992 | Gotou . |
| 5,142,639 | 8/1992 | Kohyama et al. . |
| 5,155,657 | 10/1992 | Oehrlein et al. . |
| 5,158,905 | 10/1992 | Ahn . |

(List continued on next page.)

FOREIGN PATENT DOCUMENTS

| | | |
|---|---|---|
| 0 516 031 A1 | 12/1992 | European Pat. Off. . |
| 4-26156 | 1/1992 | Japan . |
| 5-21745 A | 1/1993 | Japan . |
| 5-251657 | 9/1993 | Japan . |
| 6-151748 | 5/1994 | Japan . |
| 2 252 447 | 8/1992 | United Kingdom . |

OTHER PUBLICATIONS

"Mini–Trenches in Polysilicon For Dram Storage Capacitance Enhancement", IBM Technical Disclosure Bulletin, vol. 33, No. 9, Feb.

Ema et al. "3–Dimensional Stacked Capacitor Cell for 16M and 64M DRAMS", International Electron Devices Meeting, pp. 592–595, Dec.

Wakamiya et al., "Novel Stacked Capacitor Cell for 64–Mb DRAM", 1989 Symposium on VLSI Technology Digest of Technical papers, pp. 69–70.

Ema et al., "3–Dimensional Stacked Capacitor Cell for 16M and 64M DRAMS", International Electron Devices Meeting, pp. 592–595, Dec. 1988.

Wakamiya et al., "Novel Stacked Capacitor Cell for 64–Mb DRAM", 1989 Symposium on VLSI Technology Digest of Technical Papers, pp. 69–70, No Month.

*Primary Examiner*—Charles L. Bowers, Jr.
*Assistant Examiner*—Craig Thompson
*Attorney, Agent, or Firm*—Rabin & Champagne, P.C.

[57] ABSTRACT

Fabricating a semiconductor memory device with a capacitor includes forming a first insulating layer on a substrate, covering a transfer transistor, and forming a first conducting layer that penetrates the first insulating layer and is electrically coupled to one of a drain or source region of the transfer transistor. Thereafter, a pillar layer is formed at the periphery of and above the first conducting layer, and a second conducting layer is also formed on sidewalls of the pillar layer. Next, alternately a first and a second film layer are formed at least once over the first conducting layer and the second conducting layer. Then, a second insulating layer is formed above the second film layer. After that, a third conducting layer is formed and then defined such that the first, the second, and the third conducting layers, in combination with the second film layer, form a storage electrode of a charge storage capacitor. After removing the pillar layer, the first film layer and the second insulating layer, a dielectric layer is formed on the exposed surface of the first, the second and the third conducting layers. Finally, a fourth conducting layer is formed over the surface of the dielectric layer resulting in the formation of an opposing electrode of the charge storage capacitor.

20 Claims, 18 Drawing Sheets

U.S. PATENT DOCUMENTS

| | | |
|---|---|---|
| 5,164,337 | 11/1992 | Ogawa et al. . |
| 5,172,201 | 12/1992 | Suizu . |
| 5,196,365 | 3/1993 | Gotou . |
| 5,206,787 | 4/1993 | Fujioka . |
| 5,266,512 | 11/1993 | Kirsch . |
| 5,274,258 | 12/1993 | Ahn . |
| 5,338,955 | 8/1994 | Tamura et al. . |
| 5,354,704 | 10/1994 | Yang et al. . |
| 5,371,701 | 12/1994 | Lee et al. . |
| 5,389,568 | 2/1995 | Yun . |
| 5,399,518 | 3/1995 | Sim et al. . |
| 5,438,011 | 8/1995 | Blalock et al. . |
| 5,443,993 | 8/1995 | Park et al. . |
| 5,453,633 | 9/1995 | Yun . |
| 5,460,996 | 10/1995 | Ryou . |
| 5,478,768 | 12/1995 | Iwasa . |
| 5,478,770 | 12/1995 | Kim . |
| 5,482,886 | 1/1996 | Park et al. . |
| 5,508,222 | 4/1996 | Sakao . |
| 5,521,419 | 5/1996 | Wakamiya et al. . |
| 5,523,542 | 6/1996 | Chen et al. . |
| 5,543,346 | 8/1996 | Keum et al. . |
| 5,550,080 | 8/1996 | Kim . |
| 5,561,309 | 10/1996 | Cho et al. . |
| 5,561,310 | 10/1996 | Woo et al. . |
| 5,572,053 | 11/1996 | Ema . |
| 5,595,931 | 1/1997 | Kim . |

METHOD OF FABRICATING A SEMICONDUCTOR MEMORY CELL HAVING A TREE-TYPE CAPACITOR

BACKGROUND OF THE INVENTION

1. Field of the Invention

This invention relates in general to semiconductor memory device, and more particularly to a structure of a dynamic random access memory (DRAM) cell having a transfer transistor and a tree-type charge storage capacitor.

2. Description of the Related Art

FIG. 1 is a circuit diagram of a conventional memory cell for a DRAM device. As shown in the drawing, a DRAM cell is substantially composed of a transfer transistor T and a charge storage capacitor C. A source terminal of the transfer transistor T is connected to a corresponding bit line BL, and a drain terminal thereof is connected to a storage electrode 6 of the charge storage capacitor C. A gate terminal of the transfer transistor T is connected to a corresponding word line WL. An opposing electrode 8 of the capacitor C is connected to a constant power source. A dielectric film 7 is provided between the storage electrode 6 and the opposing electrode 8 of capacitor C.

In the conventional DRAM manufacturing process, substantially two-dimensional capacitors called planar type capacitors are formed for use with the conventional DRAM devices having a storage capacity less than 1 Mb (million bytes). In the case of a DRAM having a memory cell using a planar type capacitor, electric charges are stored on electrodes disposed on the main surface of a semiconductor substrate, so that the main surface is required to have a relatively large area. This type of a memory cell is therefore not suited for a DRAM having a high level of integration. For a high integration DRAM, such as a DRAM with more than 4 Mb of memory, a three-dimensional capacitor structure, called a stacked-type or a trench-type capacitor, has been introduced.

With the stacked-type or trench-type capacitor, it has been possible to obtain a larger memory for a similar surface area. However, to realize a semiconductor device of an even higher level of integration, such as a very-large-scale integration (VLSI) circuit having a capacity of 64 Mb, a capacitor with a simple three-dimensional structure, such as the conventional stacked-type or trench-type, turns out to be insufficient.

One solution for improving the capacitance of a DRAM memory cell storage capacitor is to use the so-called fin-type stacked capacitor, an example of, which is proposed in Ema et al., "3-Dimensional Stacked Capacitor Cell for 16 M and 64 M DRAMs", International Electronic Devices Meeting, pp. 592–595, Dec. 1988. The fin-type stacked capacitor includes electrodes and dielectric films which extend horizontally in a fin shape in a plurality of stacked layers to increase the surface areas of the electrodes. DRAMs having the fin-type stacked capacitor are also disclosed in U.S. Pat. Nos. 5,071,783; 5,126,810; and 5,206,787.

Another solution for improving the capacitance of a memory cell storage capacitor is to use the so-called cylindrical-type stacked capacitor, an example of, which is proposed in Wakamiya et al., "Novel Stacked Capacitor Cell for 64-Mb DRAM," 1989 Symposium on VLSI Technology Digest of Technical Papers, pp. 69–70. The cylindrical-type stacked capacitor includes electrodes and dielectric films which extend vertically in a cylindrical shape to increase the surface areas of the electrodes. A DRAM having the cylindrical-type stacked capacitor is also disclosed in U.S. Pat. No. 5,077,688.

With the trend toward increased integration density, the size of the DRAM cell in a plane (the surface area it occupies in a plane) must be further reduced. Generally, a reduction in the size of the memory cell leads to a reduction in charge storage capacity (capacitance) of the storage capacitor. Additionally, as the capacitance is reduced, the likelihood of soft errors arising from the incidence of alpha-rays is increased. Therefore, there is a need in this field for a new storage capacitor structure which can maintain capacitance, while occupying a smaller surface area of the device, and a suitable method of fabricating the structure.

SUMMARY OF THE INVENTION

It is therefore an object of this invention to provide a method for fabricating a semiconductor memory device having a tree-type capacitor structure that provides an increased area for charge storage without using additional surface area of the device.

In accordance with one preferred embodiment of the invention, a method for fabricating a semiconductor memory device is provided, the semiconductor memory device including a substrate, a transfer transistor formed on the substrate, and a charge storage capacitor electrically coupled to one of the source/drain regions of the transfer transistor. The method of fabrication includes providing a substrate having a transfer transistor formed thereon; forming a first insulating layer over the substrate, covering the transfer transistor; forming a first conducting layer which penetrates at least through the first insulating layer and is electrically coupled to a source/drain region of the transfer transistor; forming a pillar-shaped layer above the first insulating layer at sides of the first conducting layer, the pillar layer having at least one recess above the first conducting layer; forming a second conducting layer on sidewalls of the at least one recess of the pillar layer; alternately forming first and second film layers at least once over the first conducting layer, the second conducting layer and the pillar layer, with the second film layer composing of conducting material while the first film layer composing of insulating material; defining the first and the second film layers and dividing up the section above the pillar layer; forming a second insulating layer over the second film layer, filling up the space in the recess area of the second film layer; forming a third conducting layer covering the pillar layer, the first and the second film layers, the second conducting layer and the second insulating layer; defining the third conducting layer and the second film layer so as to divide up the third conducting layer and the second film layer inside the recess area, one end of the second conducting layer is connected to the periphery of the first conducting layer while the other end of the second conducting layer is connected to one end of the third conducting layer, and the first, the second and the third conducting layers in combination form a trunk-like conducting layer structure, and the second film layer with one end connected to the lower surface of the third conducting layer forms a branch-like conducting layer structure in cross-section, and the first, the second, the third conducting layers in combination with the second film layer form a storage electrode of the charge storage capacitor; removing the pillar layer, the second insulating layer and the first film layer; forming a dielectric layer over the exposed surfaces of the first, the second, the third conducting layer and the second film layer; and forming a fourth conducting layer over the surface of the dielectric layer as an opposing electrode of the charge storage capacitor.

According to one aspect of the invention, the trunk-like conducting layer includes a lower trunk section having a bottom end electrically coupled to a source/drain region of the transfer transistor; a middle trunk section extending substantially upright away from the lower trunk section; and an upper trunk section extending horizontally from the upper end of the middle trunk section. The lower trunk section can be T-shaped or U-shaped in cross section, for example, while the middle trunk section can be a hollow cylindrical shape, a box-like rectangular shape, or other suitable shape.

According to another embodiment of the invention, the following steps are included after forming the first insulating layer and before forming the first conductive layer.

First, forming an etching protection layer above the first insulating layer, then forming a third insulating layer over the etching protection layer. Forming the first conductive layer further includes forming a first conducting layer that penetrates through the third insulating layer and the etching protection layer. Lastly, the removing step further includes the step of removing the third insulating layer.

In accordance with a further preferred embodiment of the invention, a method is provided for fabricating a semiconductor memory device which includes a substrate, a transfer transistor formed on the substrate, and a charge storage capacitor electrically coupled to one of the source or drain regions of the transfer transistor. The method of fabrication includes forming a first insulating layer over the substrate, covering the transfer transistor; forming a first conducting layer, which penetrates at least through the first insulating layer, and is electrically coupled to one of the source/drain regions of the transfer transistor; forming a pillar layer above the first conducting layer; forming a second conducting layer on the surface of the pillar layer; forming a second insulating layer over the second conducting layer, filling up the space in the recess area of the second conducting layer; defining the second conducting layer and the second insulating layer, and dividing up the section above the pillar layer; defining the pillar layer and forming an opening in it; forming a third conducting layer on the bottom and sidewalls of the opening, and over the second conducting layer and the second insulating layer; defining the third conducting layer and the second conducting layer, so as to divide up the third conducting layer at the bottom of the opening as well as the third and the second conducting layers at a position above the source/drain regions which is electrically coupled to the first conducting layer, one end of the third conducting layer is connected to the periphery of the first conducting layer, and the third conducting layer and the first conducting layer in combination form a trunk-like conducting layer, one end of the second conducting layer is connected to the internal surface of the third conducting layer and forms a branch-like conducting layer, and that the first, the second and the third conducting layers in combination form a storage electrode of the charge storage capacitor; removing the pillar layer and the second insulating layer; forming a dielectric layer over the exposed surfaces of the first, the second and the third conducting layers; and forming a fourth conducting layer over the surface of the dielectric layer resulting in the formation of an opposing electrode of the charge storage capacitor.

According to one aspect of the invention, a branch-like conducting layer formed by the second conducting layer includes a section with multiple segments having a crooked or zigzag cross section, and one end of the crooked multiple segment section is connected to the internal surface of the third conducting layer. The fabricating method used in the invention, after forming the second conducting layer and before forming the second insulating layer further includes alternately forming a first and a second film layers at least once over the surface of second conducting layer, with the second film layer composing of conducting material while the first film layer composing of insulating material. In addition, the step of defining the third conducting layer further includes dividing up the second film layer at a position above the source/drain regions which is electrically coupled to the first conducting layer, and the step of removing further includes the removal of the first film layer. The second film layer forms part of the branch-like conducting layer which includes a multiple-segment section with a crooked cross section, and that one end of the crooked multiple-segment section is connected to the internal surface of the third conducting layer almost parallel to the second conducting layer.

According to a another aspect of the invention, the third conducting layer can also include a third film layer and a fourth film layer. The sequence is to form the third film layer over the second conducting layer first, and then form the fourth film layer on the sidewalls of the opening. One end of the fourth film layer is connected to the periphery of the first conducting layer and one end of the third film layer is connected to the other end of the fourth film layer.

According to another aspect of the invention, the step of forming the pillar layer further includes forming a thick insulating layer over the first conducting layer; forming a photoresist layer covering the thick insulating layer except the designed recess areas; etching away part of the uncovered thick insulating layer; eroding the photoresist layer so as to expose part of the thick insulating layer again; etching away part of the exposed thick insulating layer so as to form a pillar layer with a staircase-like cross section; and removing the photoresist layer.

In accordance with a further preferred embodiment of the invention, a method is provided for fabricating a semiconductor memory device having a substrate, a transfer transistor formed on the substrate, and a charge storage capacitor electrically coupled to one of the source or drain regions of the transfer transistor. The method of fabrication includes forming a first insulating layer over the substrate, covering the transfer transistor; forming a first conducting layer, which penetrates at least through the first insulating layer, and is electrically coupled to one of the source/drain regions of the transfer transistor; forming a pillar layer above the periphery of the first conducting layer that has at least one recess in the pillar layer; forming a second conducting layer on the surface of the pillar layer; alternately forming a first and a second film layers at least once over the surface of the second conducting layer, with the second film layer composing of conducting material while the first film layer composing of insulating material; defining the first, the second film layers and the second conducting layer and then forming an opening above the pillar layer; forming a third conducting layer on the sidewalls of the opening; defining the second film layer and then dividing up the second film layer inside the recess area, the periphery of the second conducting layer is connected to the periphery of the first conducting layer, one end of the third conducting layer is connected to one end of the second conducting layer, and the first, the second and the third conducting layers in combination form a trunk-like conducting layer, while the second film layer with one end connected to the internal surface of the third conducting layer forms a branch-like conducting layer, and that the first, the second, the third conducting layer in combination with the second film layer form a storage electrode of the charge storage capacitor; removing the pillar layer and the first film layer; forming a dielectric layer over the exposed surface of the first, the second, the third conducting layer and the second film layer; and forming a fourth conducting layer over the surface of the dielectric layer resulting in the formation of an opposing electrode of the charge storage capacitor.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DETAILED DESCRIPTION OF THE PREFERRED EMBODIMENTS

First Preferred Embodiment

A description will be now given of a first exemplary embodiment of a method of fabricating a semiconductor memory device having a tree-type charge storage capacitor according to the invention, by referring to FIGS. 2A through 2I.

Figure 1:
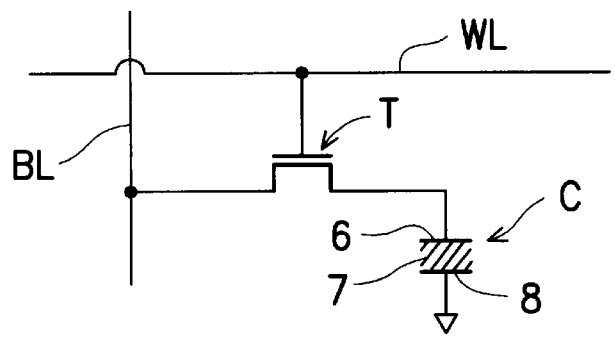
FIG. 1 is a circuit diagram of a conventional memory cell of a DRAM device.
Figure 2A:
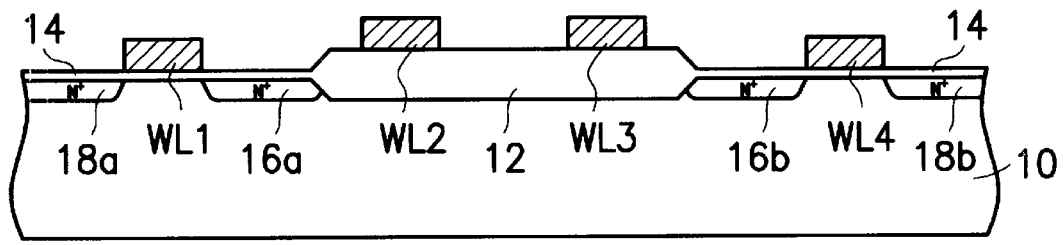
FIG. 2A through 2I are cross-sectional views for explaining a first embodiment of a method for fabricating a semiconductor memory device according to the invention.

Referring to FIG. 2A, a surface of a silicon substrate 10 is subjected to thermal oxidation by the LOCOS (local oxidation of silicon) technique, and thereby a field oxidation layer 12 having a thickness of approximately 3000 Å (Angstroms), for example, is formed. Next, a gate oxide layer 14 having a thickness of approximately 150 Å, for example, is formed by subjecting the silicon substrate 10 to the thermal oxidation process. Then a polysilicon layer having a thickness of approximately 2000 Å, for example, is deposited on the entire surface by CVD (chemical vapor deposition) or LPCVD (low pressure CVD). In order to obtain a polysilicon layer of low resistance, suitable impurities such as phosphorus ions, for example, are implanted into the polysilicon layer. Preferably, a refractory metal layer is deposited over the polysilicon layer, and then an annealing process is carried out to form polycide, so that the resistance of the layer is further decreased. The refractory metal may be tungsten (W) for example, with a thickness of approximately 2000 Å. Thereafter, the polycide is subjected to a patterning process to form gate electrodes (or word lines) WL1 through WL4, as shown in FIG. 2A. Then, arsenic ions, for example, are implanted at an energy of 70 KeV and dosage of approximately $1 \times 10^{15}$ atoms/cm$^2$, for example. In this step, the word lines WL1 through WL4 are used as masking layers. Thereby, drain regions 16a and 16b and source regions 18a and 18b are formed in the silicon substrate 10.

Figure 2B:
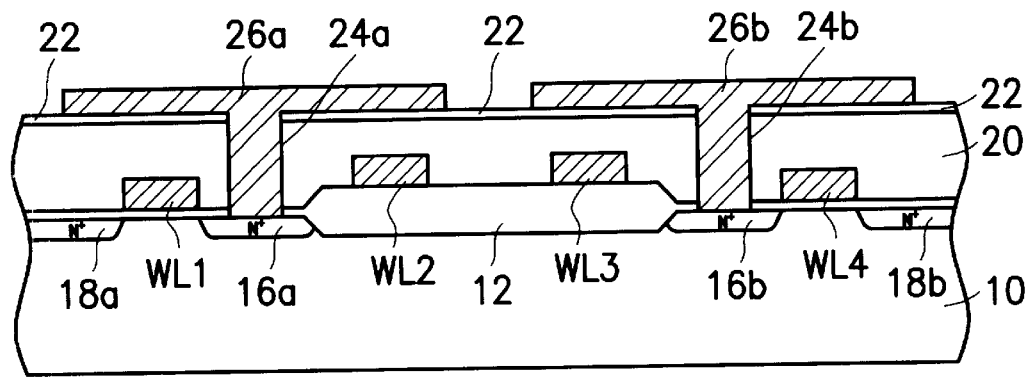

Referring next to FIG. 2B, in a subsequent step, the CVD method is used to deposit a planarization insulating layer 20 of, for example, borophosphosilicate glass (BPSG), to a thickness of approximately 7000 Å, for example. Then the same method is used to form an etching protection layer 22, which can be, for example, a silicon nitride layer, having a thickness of approximately 1000 Å, for example. After that, conventional photolithographic and etching processes are used to etch selected parts of the etching protection layer 22, the planarization insulating layer 20 and the gate oxide layer 14, to form storage electrode contact holes 24a, 24b which extend from the top surface of the etching protection layer 22 to the top surface of the drain regions 16a and 16b. Next, a polysilicon layer is deposited over the etching protection layer 22, and conventional photolithographic and etching processes are used to define the polysilicon layer, to form polysilicon layers 26a and 26b marking out the location of a storage electrode of a charge storage capacitor for each memory cell. To increase the conductivity of the polysilicon layers, arsenic ions, for example, can be implanted into the layers. As shown in the drawing, storage electrode contact holes 24a, 24b are filled by respective polysilicon layers 26a and 26b, and the polysilicon layers further cover part of the surface of the etching protection layer 22. The polysilicon layers 26a and 26b, however, may be separated form the etching protection layer 22 by some distance as will de described relative to another embodiment.

Figure 2C:
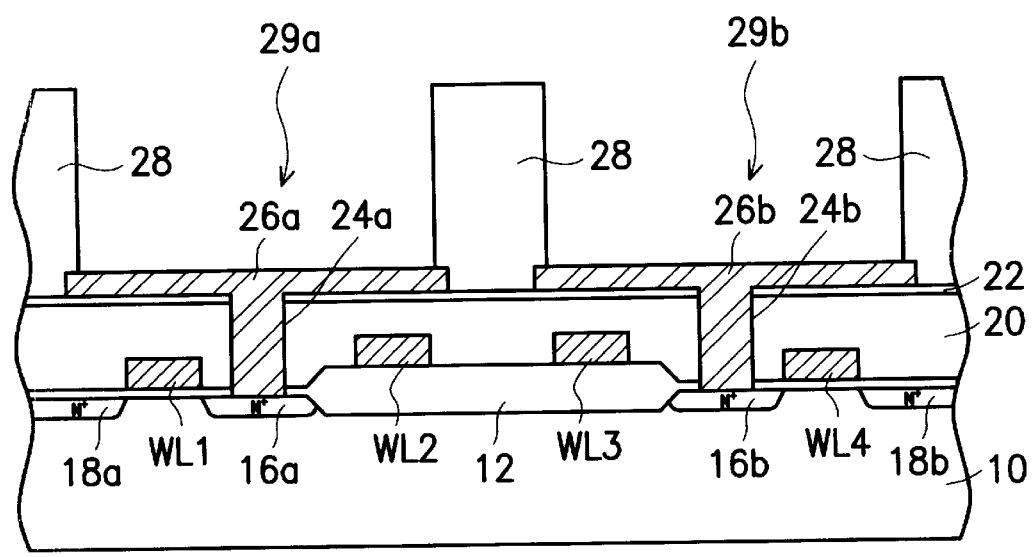

Referring next to FIG. 2C, in a subsequent step, a thick insulating layer of, for example, silicon dioxide, is deposited over the wafer to a thickness of approximately 7000 Å. Then, conventional photolithographic and etching processes are used to etch away selected parts of the insulating layer, to form insulating pillars 28 as shown in the drawing. The insulating pillars are bounded by a plurality of recesses 29a and 29b, and the centers of the recesses 29a and 29b are preferably located directly above the center of the respective drain regions 16a and 16b.

Figure 2D:
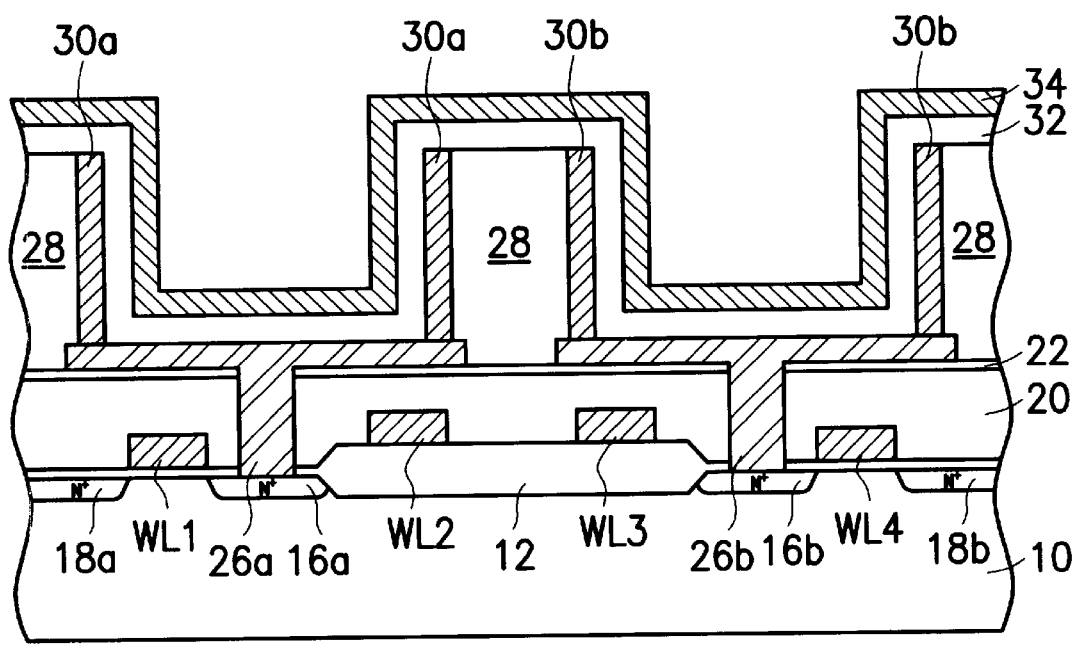

Referring next to FIG. 2D, in a subsequent step, polysilicon spacers 30a and 30b are formed on the sidewalls of the insulating pillars 28. In this preferred embodiment, the polysilicon spacers 30a and 30b can be fabricated by the following steps: a polysilicon layer is deposited to a thickness of approximately 1000 Å, for example, followed by an etch back process. Next, the CVD method is used successively to form an insulating layer 32 and a polysilicon layer 34. The insulating layer 32 can be, for example, a silicon dioxide layer, having a thickness of approximately 1000 Å, and the thickness of the polysilicon layer 34 is approximately 1000 Å, for example. To increase the conductivity of the polysilicon layer 34, arsenic ions, for example, can be implanted into the layer.

Figure 2E:
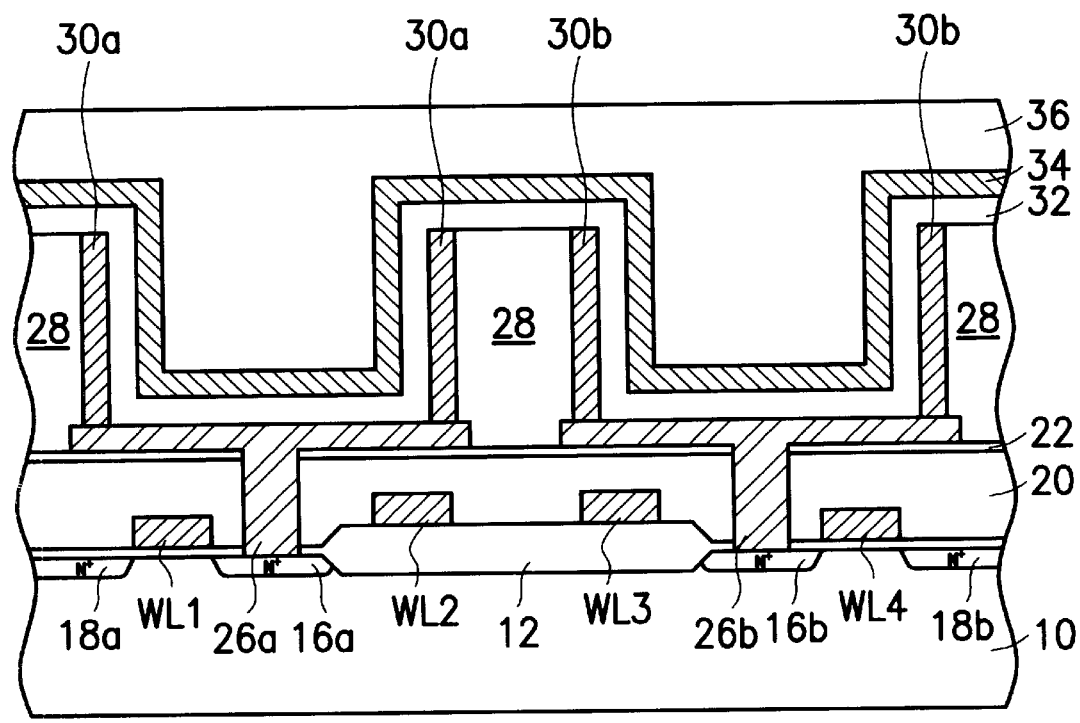

Referring next to FIG. 2E, in a subsequent step, the CVD method is used to deposit an insulating layer 36 on the surface of polysilicon layer 34, preferably at least filling up the remainder of the recesses 29a and 29b between the insulating pillars 28. In this preferred embodiment, the thickness of insulating layer 36 is approximately 7000 Å, for example.

Figure 2F:
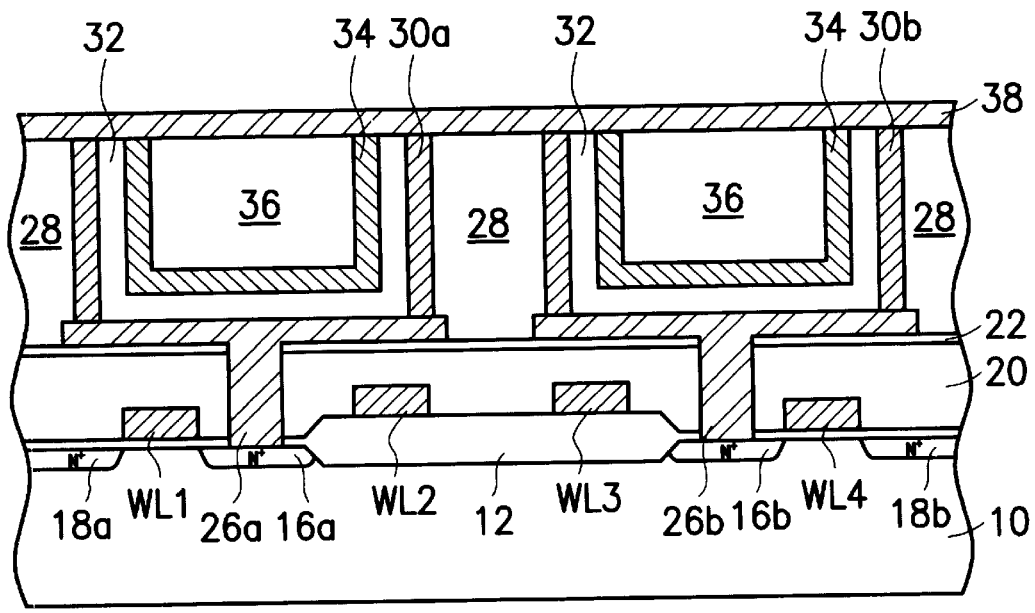

Referring next to FIG. 2F, in a subsequent step, chemical-mechanical polishing (CMP) is performed on the surface of the wafer as shown in FIG. 2E until an upper part of the insulating pillar 28 is exposed. Then, the CVD method is used to deposit a polysilicon layer 38, for example, to a thickness of approximately 1000 Å. To increase the conductivity of the layer, arsenic ions, for example, can be implanted into the polysilicon layer 38.

Figure 2G:
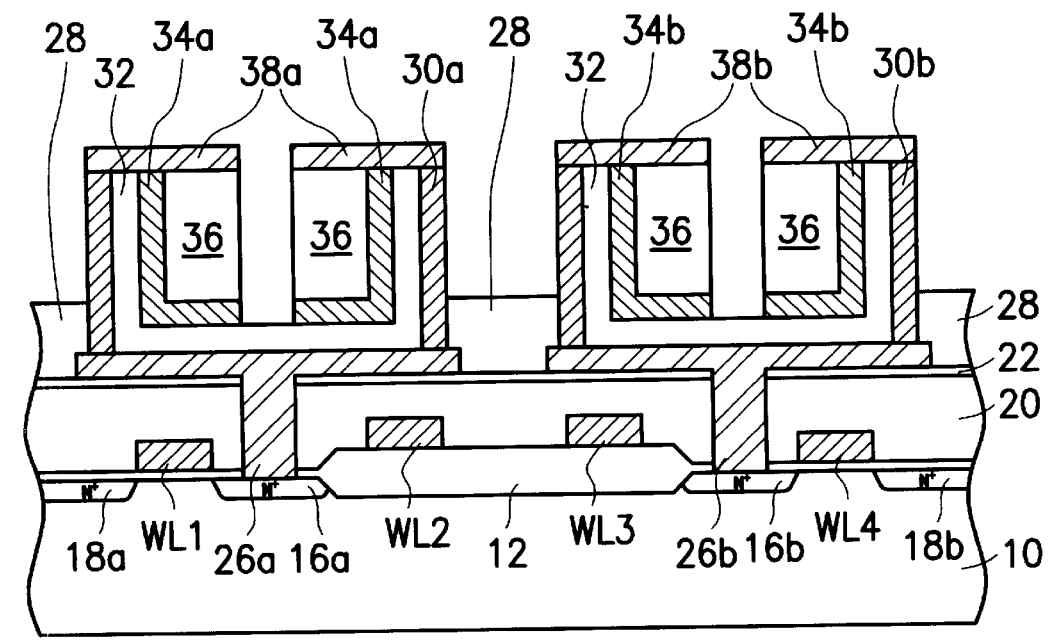

Referring next to FIG. 2G, in the subsequent step, in areas approximately above the drain regions 16a, 16b, and in the areas above the intermediate regions between the adjacent charge storage capacitors being formed, conventional photolithographic and etching processes are carried out to selectively etch, in sequence, first the polysilicon layer 38, the pillar insulating layer 28 and the insulating layer 36 inside recesses 29a and 29b, and finally the polysilicon layer 34. Through the above etching operations, polysilicon layers 38 and 34 are sliced into a number of sections, i.e., 38a, 38b and 34a, 34b.

Figure 2H:
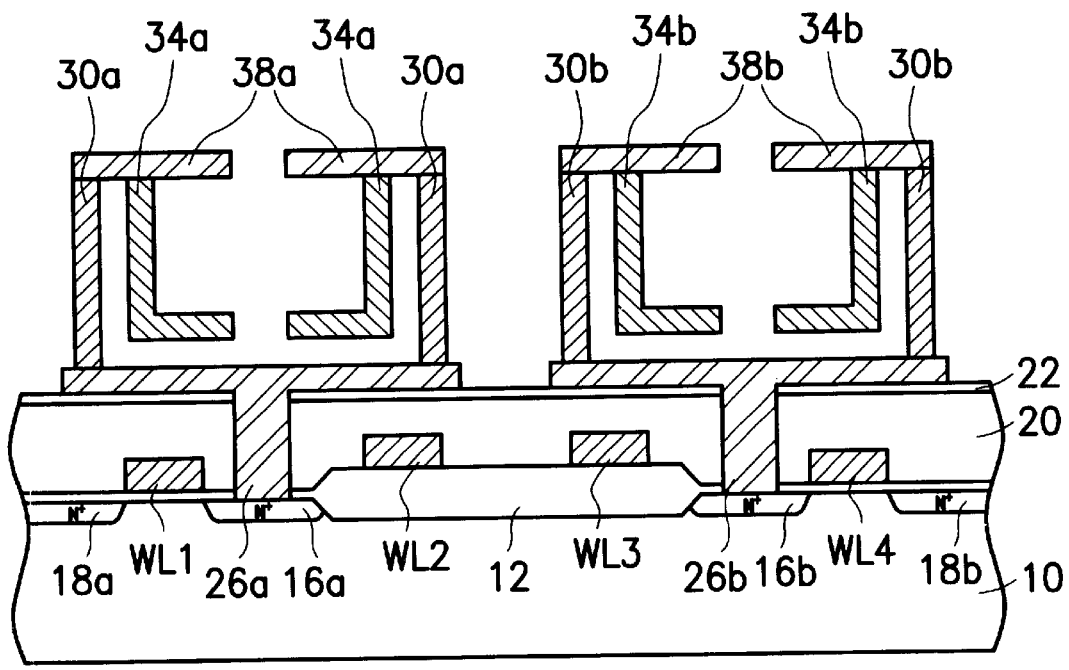

Referring next to FIG. 2H, in a subsequent step, wet etching is performed on the wafer with the etching protection layer 22 as the etch end point, to completely remove the exposed silicon dioxide layers, such as the insulating layers 36, 32 and the insulating pillar 28. The fabrication of storage electrodes of charge storage capacitors for the DRAM is thus completed. As shown in FIG. 2H, the storage electrodes are made up of respective lower trunk-like polysilicon layers 26a, 26b; middle trunk-like polysilicon layers 30a, 30b; upper trunk-like polysilicon layers 38a, 38b; and branch-like polysilicon layers 34a, 34b having an L-shaped cross section. The lower trunk-like polysilicon layers 26a, 26b are respectively electrically coupled to the drain regions 16a and 16b of the respective transfer transistors of the DRAM, and have a T-shaped cross section. The lower ends of the middle trunk-like polysilicon layers 30a, 30b are connected to the periphery of the lower trunk-like polysilicon layers 26a and 26b, and extend substantially upright therefrom away from the surface of the substrate 10. One end of the respective upper trunk-like polysilicon layers 38a, 38b is connected to the upper end of the middle trunk-like polysilicon layers 30a and 30b, and layers 38a, 38b extend horizontally inward therefrom parallel to the surface of the substrate 10. The middle trunk-like polysilicon layers 30a, 30b may be of a generally hollow cylindrical shape, however their horizontal cross section (not shown) can be circular, rectangular or other suitable shapes as would be readily apparent to those skilled in the art. The respective branch-like polysilicon layers 34a, 34b are attached to the lower surfaces of the upper trunk-like polysilicon layers 38a and 38b, and extend vertically down toward the surface of the substrate 10 for a certain length before extending horizontally inward toward the center of the middle trunk-like polysilicon layers 30a and 30b. Due to the particular shape of the cross-section of the storage electrodes in this invention, the storage electrodes are hereinafter in this specification referred to as "tree-like storage electrodes," O and the capacitors thus made are referred to as "tree-type charge storage capacitors." Of course, the polysilicon layers 30a, 34a and 38a are in electrical contact with each other and with layer 26a, and therefore also with drain region 16a, and likewise layers 38b, 34b, 30b and 26b are in contact with each other and with drain region 16b.

Figure 2I:
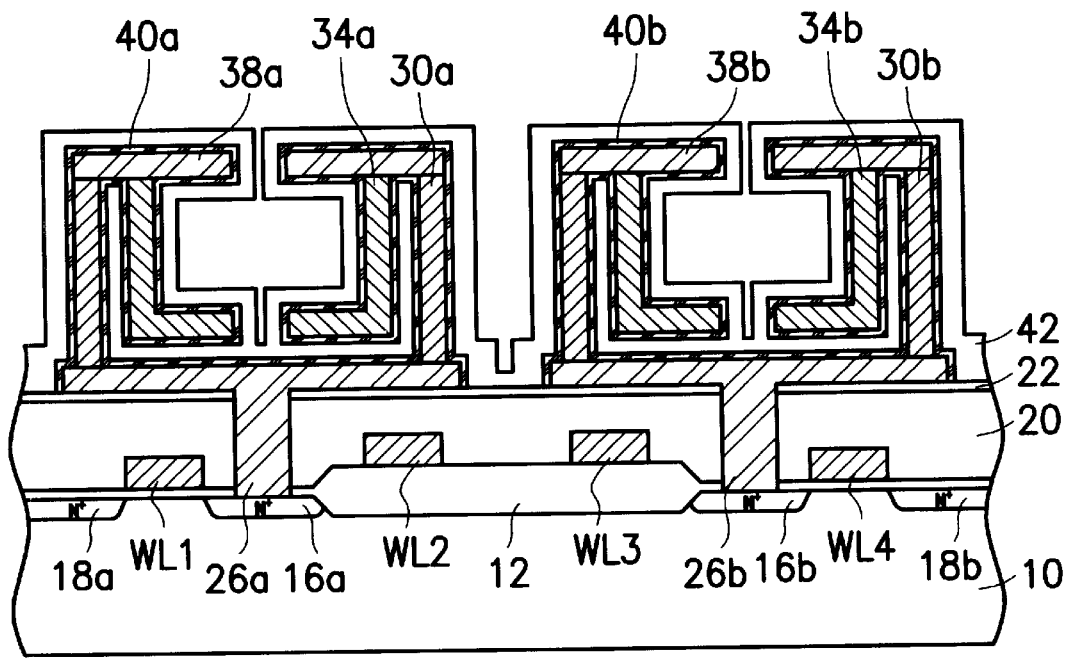

Referring next to FIG. 2I, in a subsequent step, dielectric films 40a, 40b are respectively formed over the surfaces of the tree-like storage electrode 26a, 30a, 34a, 38a and the tree-like storage electrode 26b, 30b, 34b, 38b. The dielectric films 40a, 40b can be formed of, for example, silicon dioxide, silicon nitride, NO (Silicon nitride/silicon dioxide), ONO (Silicon dioxide/Silicon nitride/Silicon dioxide), or the like. Next, an opposing electrode 42 of polysilicon, that opposes the storage electrodes (26a, 30a, 34a, 38a and 26b, 30b, 34b, 38b), is formed over the dielectric films 40a, 40b.

The process for forming the opposing electrode 42 includes a first step of depositing a polysilicon layer by the CVD method to a thickness of, for example, approximately 1000 Å, a second step of diffusing N-type impurities into the polysilicon layer to increase the conductivity, and a final step of using conventional photolithographic and etching processes to etch away selected parts of the polysilicon layer. The fabrication of the tree-type charge storage capacitor for the DRAM is then completed.

Although not shown in FIG. 2I, to complete the fabrication of the DRAM chip itself, subsequent steps include fabricating bit lines, bonding pads, interconnections, passivations, and packaging. These steps involve only conventional techniques and are not a part of the invention, so that a detailed description is not necessary and will not be provided herein.

Second Preferred Embodiment

In the foregoing first exemplary embodiment, the disclosed tree-like storage electrode has only a single branch-like electrode having an L-shaped cross section. However, the number of branches is not limited to one and can be two or more. A second exemplary embodiment of a tree-like storage electrode according to the invention which includes two branch-like electrodes each having an L-shaped cross section is now described.

The following description of the second embodiment of a semiconductor memory device having a tree-type charge storage capacitor produced according to the invention is made with reference to FIGS. 3A through 3D. This exemplary embodiment of a semiconductor memory device is produced by the second preferred method for fabricating a semiconductor memory device according to the invention.

The tree-type storage electrode of the second embodiment is based on the structure of FIG. 2D. Elements in FIGS. 3A through 3D that are identical to those in FIG. 2D are labeled with the same numerals.

Figure 3A:
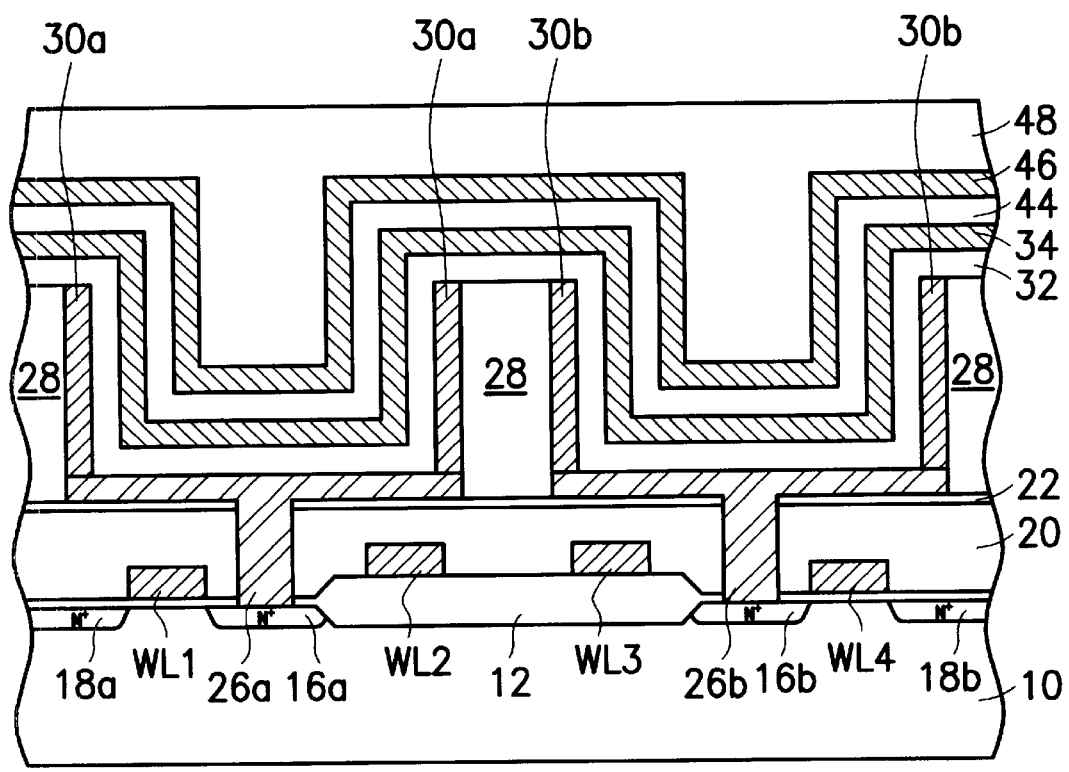
FIG. 3A through 3D are cross-sectional views for explaining a second embodiment of a method for fabricating a semiconductor memory device according to the invention.

Referring to FIG. 3A together with FIG. 2D, the CVD method is used to successively form additional alternate insulating and polysilicon layers, including a first additional insulating layer 44, a first additional polysilicon layer 46, and a second additional insulating layer 48. The insulating layers 44, 48 are formed preferably of silicon oxide, for example. The insulating layer 44 and the polysilicon layer 46 are each deposited to a thickness of approximately 1000 Å, for example, and the insulating layer 48 is deposited to a thickness of approximately 7000 Å, for example. To increase the conductivity of polysilicon layer 46, arsenic ions, for example, can be implanted into the layer.

Figure 3B:
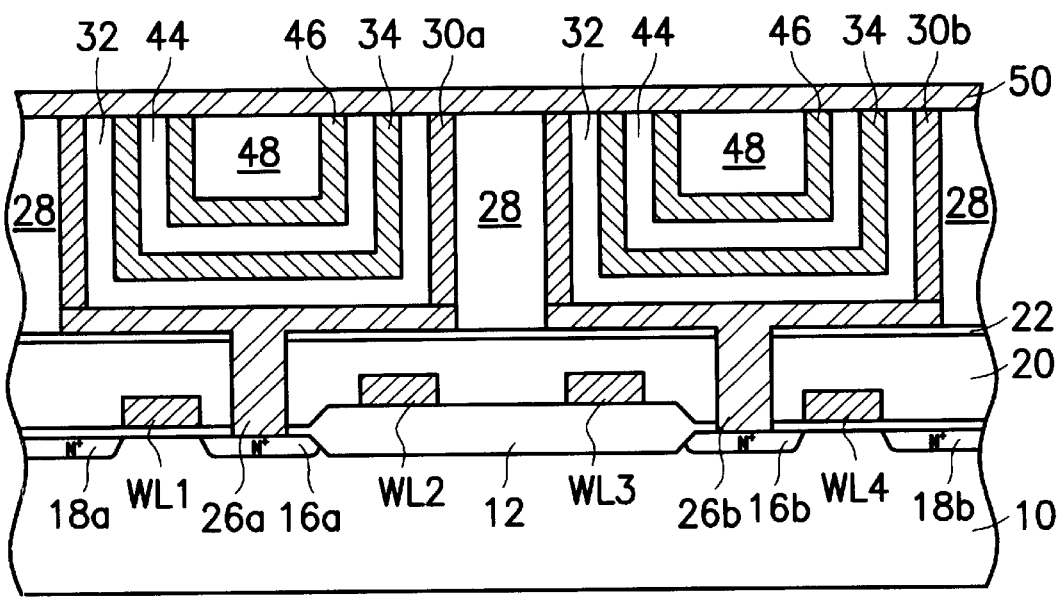

Referring next to FIG. 3B, in a subsequent step, the chemical-mechanical polishing (CMP) technique is applied to the surface shown in FIG. 3A until at least the upper part of the insulating pillar 28 is exposed. Thereafter, the CVD method is used to deposit a polysilicon layer 50 to a thickness of approximately 1000 Å, for example. To increase the conductivity of polysilicon layer 50, arsenic ions, for example, can be implanted into the layer.

Figure 3C:
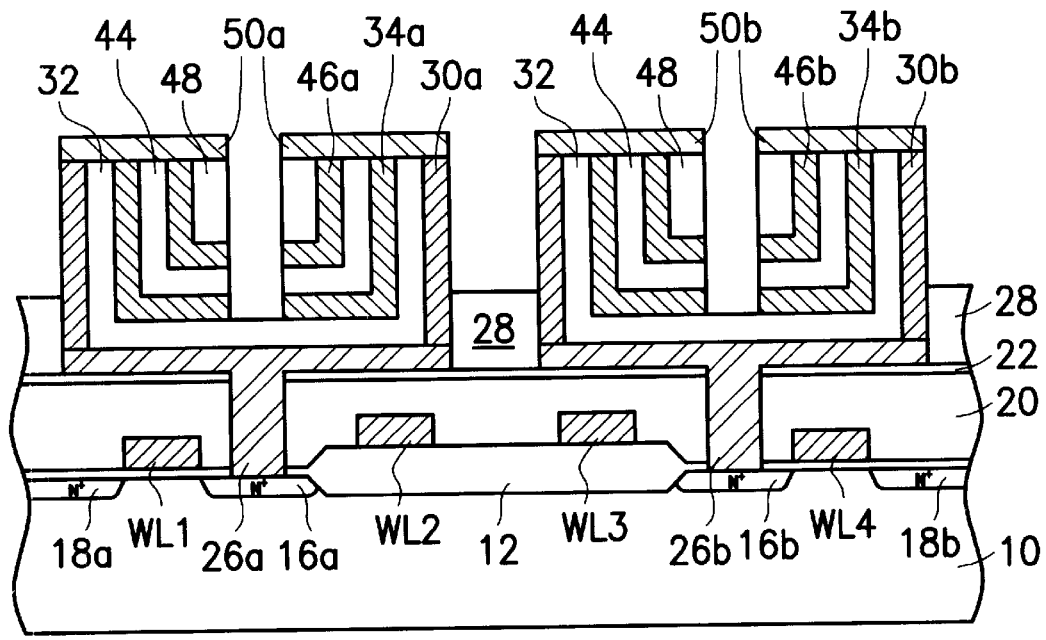

Referring next to FIG. 3C, in a subsequent step, in areas approximately above the drain regions 16a, 16b, and in the areas above the intermediate regions between the adjacent charge storage capacitors being formed, conventional photolithographic and etching processes are carried out to selectively etch, in sequence, first the polysilicon layer 50, the pillar insulating layer 28 and the insulating layer 48 inside the recesses 29a and 29b, then again the pillar insulating layer 28 and the insulating layer 44 inside the recesses 29a and 29b, and finally the polysilicon layer 34. Through the above etching operations, polysilicon layers 50, 46 and 34 are sliced into a number of sections, i.e., 50a, 50b, 46a, 46b and 34a, 34b.

Figure 3D:
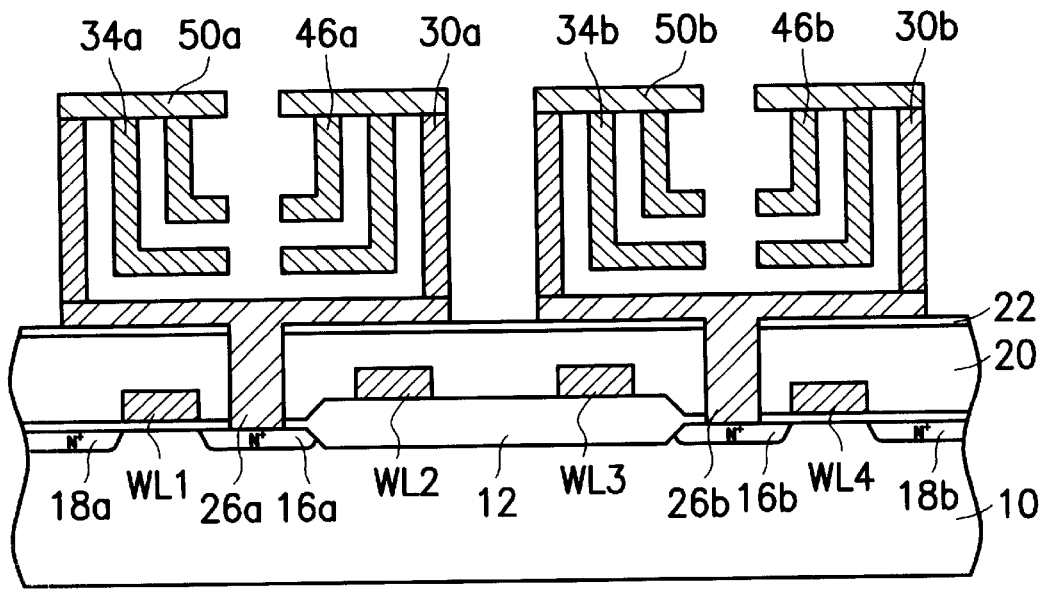

Referring next to FIG. 3D, in a subsequent step, wet etching is performed on the wafer with the etching protection layer 22 as the etch end point, to completely remove the exposed silicon dioxide layers, such as the insulating layers 48, 44, 32 and the insulating pillar 28. The fabrication of storage electrodes of charge storage capacitors for the DRAM is thus completed. As shown in FIG. 3D, the storage electrodes are made up of respective lower trunk-like polysilicon layers 26a, 26b; middle trunk-like polysilicon layers 30a, 30b; upper trunk-like polysilicon layers 50a, 50b; and two branch-like polysilicon layers 34a, 46a and 34b, 46b, respectively, each having an L-shaped cross section. The lower trunk-like polysilicon layers 26a, 26b are respectively electrically coupled to the drain regions 16a and 16b of the respective transfer transistors of the DRAM, and have a T-shaped cross section. The lower ends of the middle trunk-like polysilicon layers 30a, 30b are connected to the periphery of the lower trunk-like polysilicon layers 26a and 26b, and extend substantially upright therefrom away from the surface of the substrate 10. One end of the respective upper trunk-like polysilicon layers 50a, 50b is connected to the upper end of the middle trunk-like polysilicon layers 30a and 30b, and layers 50a and 50b extend horizontally inward therefrom parallel to the substrate 10 surface. The middle trunk-like polysilicon layers 30a,30b may be of a generally hollow cylindrical shape, however, their horizontal cross section (not shown) can be circular, rectangular or other suitable shapes that follow the shape of the insulating pillar 28 as would be readily apparent to those skilled in the art. The two respective branch-like polysilicon layers 34a, 46a and 34b, 46b are attached to the respective lower surfaces of the upper trunk-like polysilicon layers 50a and 50b, and extend vertically down toward the surface of the substrate 10 for a certain length before extending horizontally inward toward the center. Subsequent processing steps, for example, applying the dielectric films and the opposing electrode, do not differ substantially from the process described with respect to the first embodiment and, therefore, are not described again in detail herein.

Third Preferred Embodiment

In the foregoing first and second exemplary embodiments, the branch-like part of the tree-like storage electrode is L-shaped in cross section, and the lower trunk-like polysilicon layer is T-shaped in cross section. However, the invention is not limited to such a structure. The number of straight segments in the branch-like electrode is not limited to just two, but can be increased to three or more. Moreover, part of the lower trunk-like polysilicon layer can have a hollow structure, thereby increasing the surface area of the storage electrode and hence the capacitance of the device. The following description is of a third exemplary embodiment in which the branch-like part of each tree-like storage electrode has four straight segments being a zigzag shape in cross-section, and the lower trunk-like polysilicon layer has a U-shaped cross section, which increases the surface area of the storage electrode.

A description will next be given of the third exemplary embodiment of a semiconductor memory device having a tree-type charge storage capacitor formed according to the invention, by referring to FIGS. 4A through 4F. This exemplary embodiment of the semiconductor memory device is produced by a third preferred method for fabricating a semiconductor memory device according to the invention.

The tree-type storage electrode of the third embodiment is based on the structure of FIG. 2A. Elements in FIGS. 4A through 4F that are identical to those in FIG. 2A are therefore labeled with the same numerals.

Figure 4A:
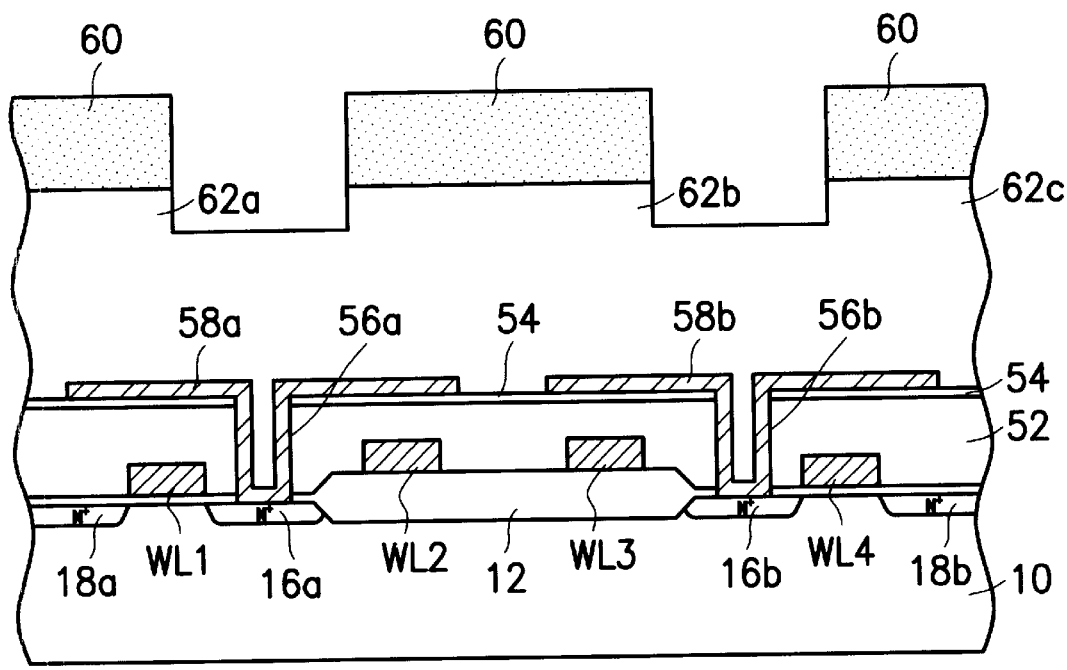
FIG. 4A through 4H are cross-sectional views for explaining a third embodiment of a method of fabricating a semiconductor memory device according to the invention.

Referring to FIG. 4A together with FIG. 2A, the CVD method is used to deposit a planarization insulating layer 52, for example using BPSG. Then the same method is used again to deposit an etching protection layer 54, for example, a silicon nitride layer. Thereafter, conventional photolithographic and etching processes are used to selectively etch, in sequence, the etching protection layer 54, the planarization insulating layer 52 and the gate oxide layer 14. As a result, storage electrode contact holes 56a and 56b are formed. The storage electrode contact holes 56a and 56b extend respectively from a top surface of the etching protection layer 54 to a top surface of the drain regions 16a and 16b. A polysilicon layer is then deposited, and conventional photolithographic and etching processes are used to define the polysilicon layer to form polysilicon layers 58a and 58b as shown in FIG. 4A, marking out the location of the storage electrode of the charge storage capacitor for each memory cell. To increase the conductivity of the polysilicon layers, arsenic ions, for example, can be implanted into the layers. As shown in FIG. 4A, the polysilicon layers 58a and 58b cover portions of the surface of the etching protection layer 54. The polysilicon layers 58a and 58b also cover the interior surfaces of the storage electrode contact holes 56a and 56b without completely filling up the holes. Therefore, the polysilicon layers 58a and 58b form a hollow structure with a U-shaped cross section. Next, a thick insulating layer is deposited, for example, a silicon dioxide layer having a thickness of approximately 7000 Å, and conventional photolithographic techniques are used to form a photoresist layer 60. Then anisotropic etching is applied to etch away part of the insulating layer, resulting in the formation of protruding insulating layers 62a, 62b and 62c, as shown in FIG. 4A.

Figure 4B:
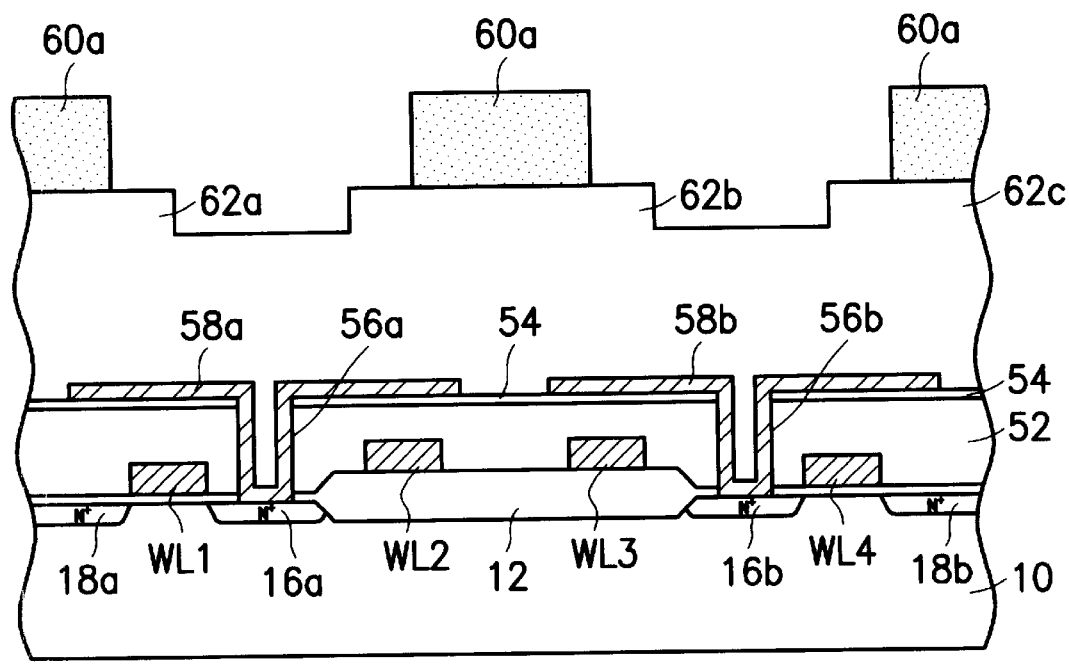

Referring next to FIG. 4B, in a subsequent step a photoresist erosion technique is performed to erode away part of the photoresist layer 60 and form a photoresist layer 60a that is reduced both in breadth and thickness (height). Part of the surface of the protruding insulating layers 62a, 62b, 62c formerly underlying the uneroded photoresist layer 60 is thereby exposed.

Figure 4C:
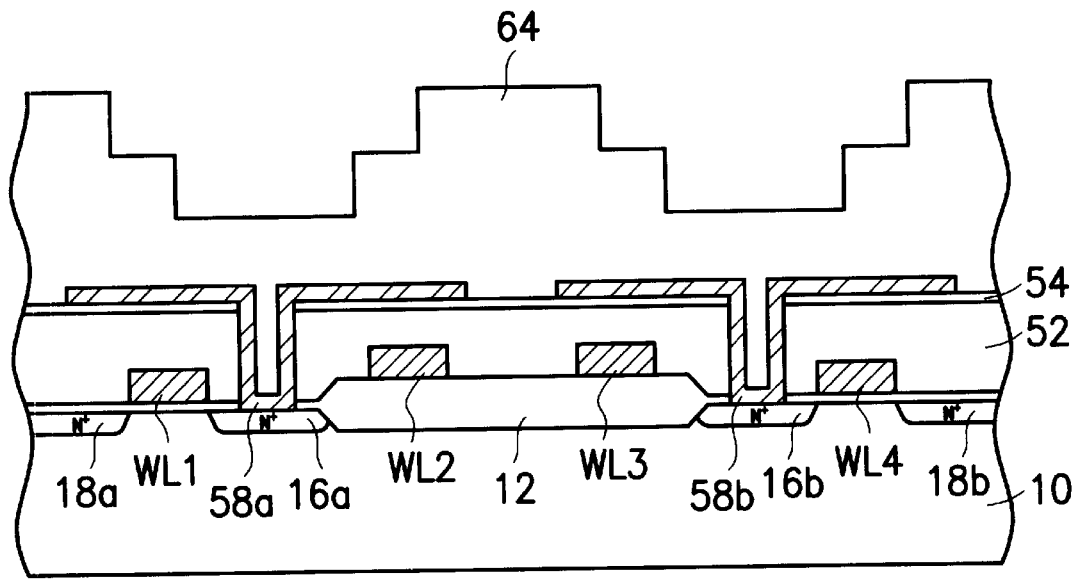

Referring next to FIG. 4C, in a subsequent step, anisotropic etching is performed on the exposed surfaces of the protruding insulating layers 62a, 62b, 62c and the residual insulating layer. Insulating pillar structures 64 having stair-like sidewalls in cross-section are thus formed. After that, the photoresist layer is removed.

Figure 4D:
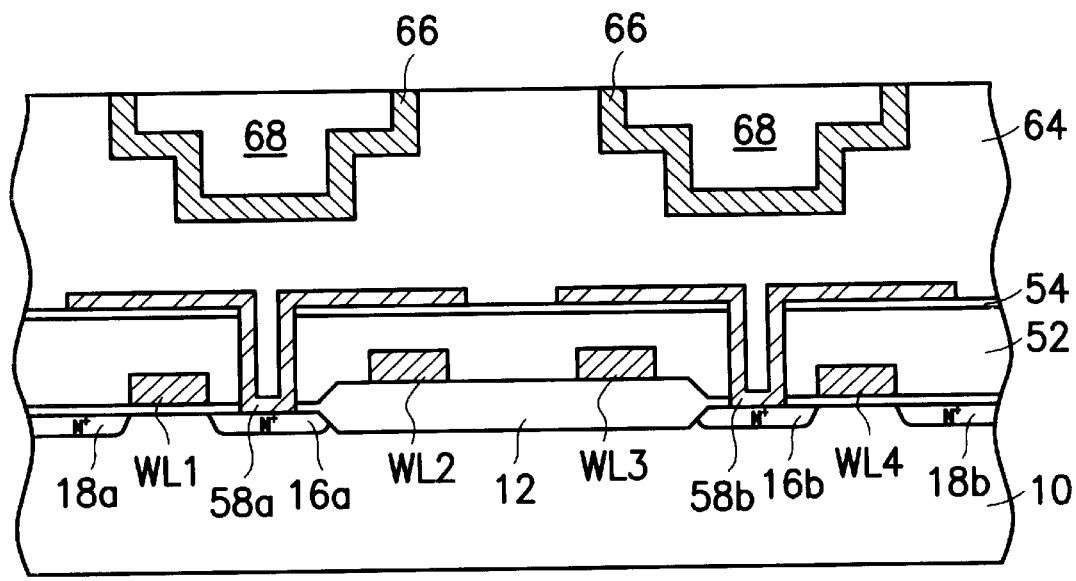

Referring next to FIG. 4D, in a subsequent step, the CVD method is used successively to form a polysilicon layer 66 and a thick insulating layer 68, and then CMP is applied to the surface of the wafer to polish away the upper part until at least the upper surface of the insulating pillar structure 64 is exposed. To increase the conductivity of polysilicon layer 66, arsenic ions, for example, can be implanted into the layer.

Figure 4E:
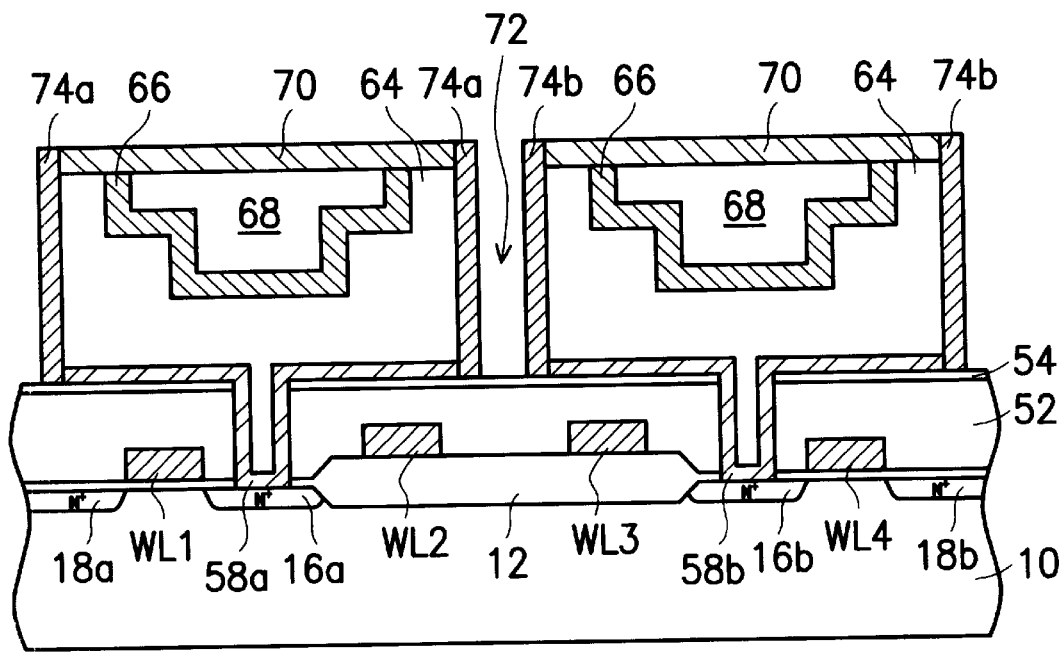

Referring next to FIG. 4E, in a subsequent step, the CVD method is used to deposit a polysilicon layer 70 to a thickness of approximately 1000 Å, for example. To increase the conductivity of polysilicon layer 70, arsenic ions, for example, can be implanted into the layer. After that, conventional photolithographic and etching processes are used to etch, in sequence, the polysilicon layer 70 and the insulating pillar 64 until the surface of the etching protection layer 54 is reached, to form a plurality of openings 72 each disposed between two adjacent areas where charge storage capacitors are being formed. Next, polysilicon layers 74a and 74b are formed on the sidewalls of the openings 72. In this preferred embodiment, polysilicon sidewalls 74a and 74b can be formed by first depositing a polysilicon layer to a thickness of approximately 1000 Å, for example, and then etching back. To increase the conductivity of the polysilicon layers 74a and 74b, arsenic ions, for example, can be implanted into the layers.

Figure 4F:
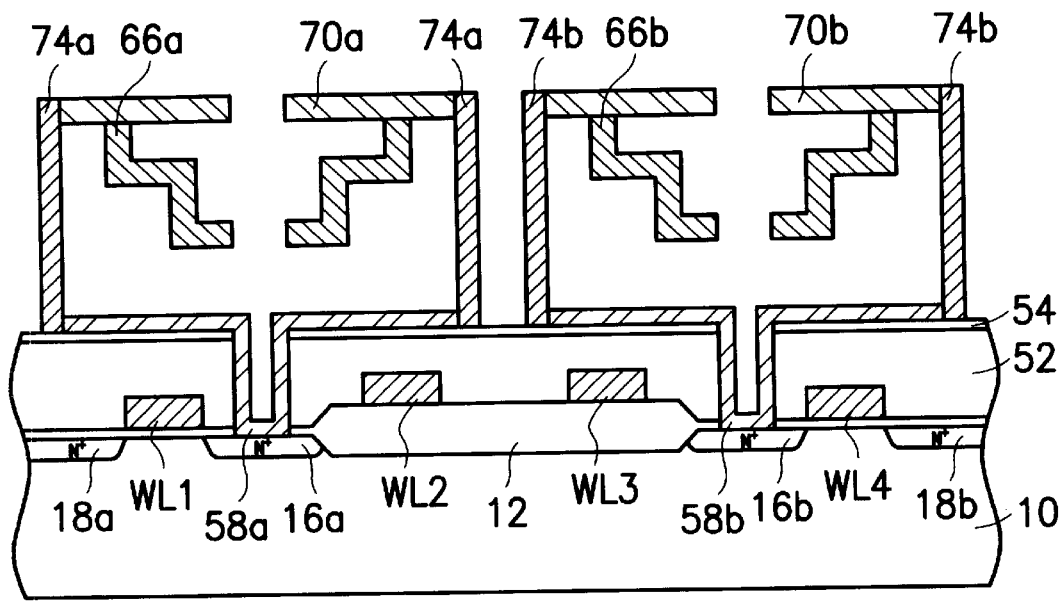
Figure 4G:
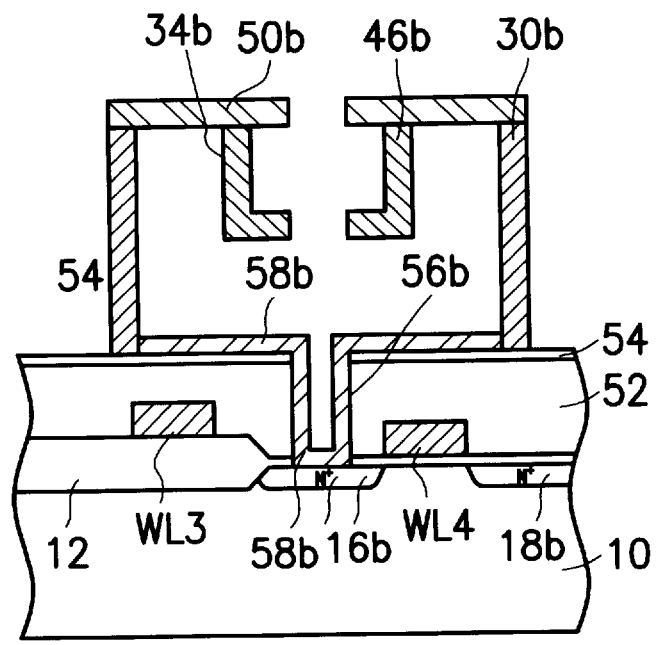
Figure 4G:
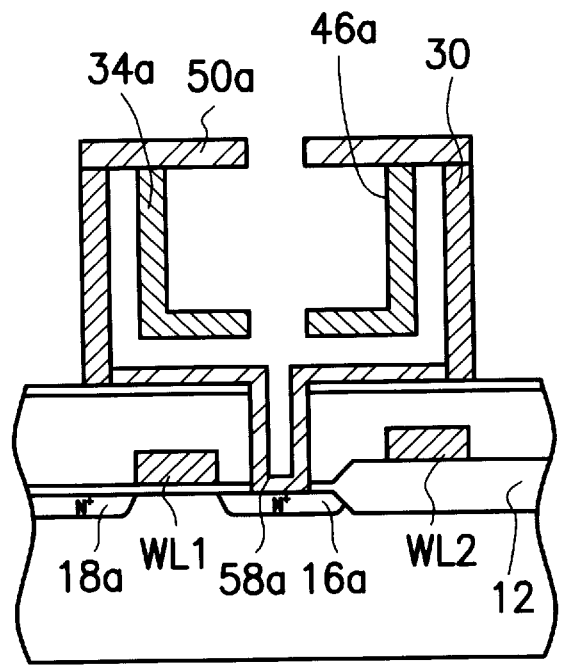
Figure 4H:
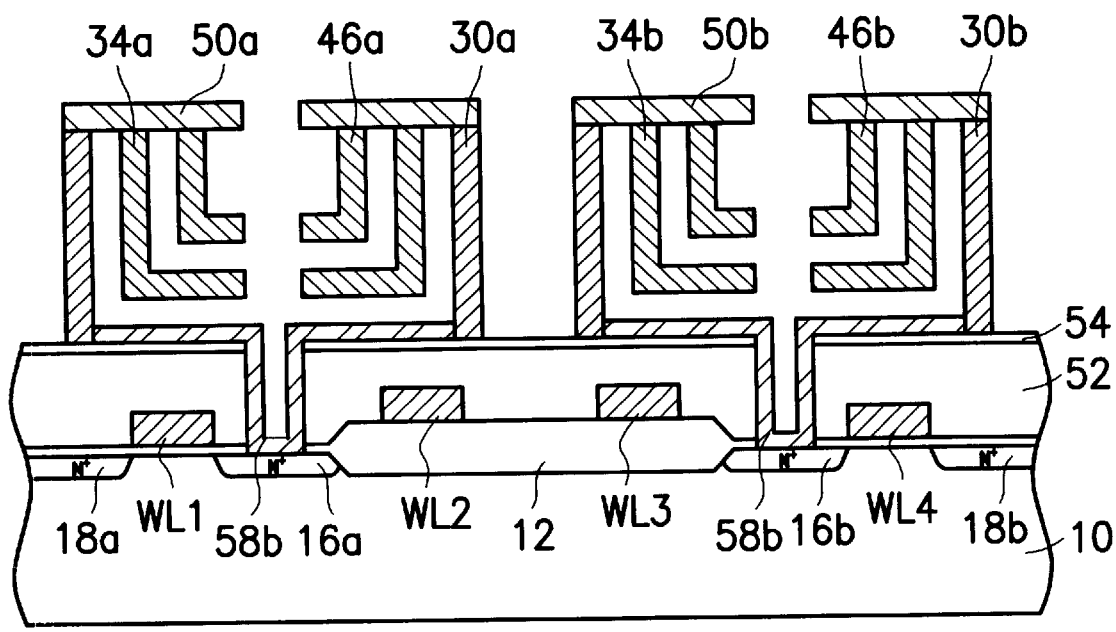

Referring next to FIG. 4F, in a subsequent step, in areas approximately above the drain regions 16a and 16b, conventional photolithographic and etching processes are then carried out to selectively etch, in sequence, first the polysilicon layer 70, then the thick insulating layer 68, finally the polysilicon layer 66. Through the above etching operations, polysilicon layers 70 and 66 are sliced into a number of sections, i.e., 70a, 70b and 66a, 66b. Lastly, wet etching is used to etch the wafer with the etching protection layer 54 as the etch end point, to completely remove the exposed silicon dioxide layers, such as the insulating layer 68 and the residual insulating pillar structure 64. The fabrication of the storage electrodes of the charge storage capacitor for the DRAM is thus completed. As shown in FIG. 4F, the storage electrodes are made up of respective lower trunk-like polysilicon layers 58a, 58b; a middle trunk-like polysilicon layers 74a, 74b; an upper trunk-like polysilicon layers 70a, 70b; and respective branch-like polysilicon layers 66a, 66b having four straight segments with a zigzag cross section (or a double L-shaped cross section). The lower trunk-like polysilicon layers 58a, 58b are respectively electrically coupled to the drain regions 16a and 16b of the transfer transistors for the DRAM, and have a U-shaped cross section. The respective lower ends of the middle trunk-like polysilicon layers 74a, 74b are connected to the periphery of the respective lower trunk-like polysilicon layers 58a and 58b, and extend substantially upright away from the substrate 10. One end of the respective upper trunk-like polysilicon layers 70a, 70b is connected to the upper end of the middle trunk-like polysilicon layers 74a and 74b, and extend horizontally inward parallel with the substrate 10 surface. The middle trunk-like polysilicon layers 74a, 74b are of a hollow cylindrical shape, however their horizontal cross section (not shown can be circular, rectangular or any other suitable shape that follow the shape of the insulating pillar structure 64 as would be readily apparent to those skilled in the art. The respective branch-like polysilicon layers 66a, 66b are attached to the lower surfaces of the respective upper trunk-like polysilicon layers 70a and 70b, and extend vertically down toward substrate 10 for a certain length before extending horizontally inward again for another distance. Subsequent processing steps, e.g., forming the dielectric and opposing electrode, do not differ substantially from the previous embodiments, therefore they are not described in detail herein.

According to the underlying principle of this preferred embodiment, if more segments of the branch-like polysilicon structure are desired, structures as indicated in FIGS. 4B and 4C can be used as the basis for photolithographic and etching processes followed by one or more anisotropic etchings on the protruding insulating layer, to form an insulating pillar having more steps in the staircase-like structure.

According to the aforementioned exemplary preferred embodiment, the ultimate shape and angle of segments on the branch-like polysilicon layer can be modified by changing the original shape and angle of the insulating pillars or protruding insulating layers. Therefore, the particular shapes and angles of the insulating pillars and protruding insulating layers are not limited to those disclosed. In fact, various methods can be used to create all kinds of shapes as would be readily apparent to those skilled in the art. For example, referring to FIG. 4A, isotropic etching or wet etching can be used instead of anisotropic etching to etch away part of the thick insulating layer. This permits the formation of near triangular-shaped insulating layers, for example, instead of the rectangular ones shown. In addition, after the formation of the insulating pillar, sidewall insulating layers can be formed on the sidewalls of the insulating pillar, to form insulating pillars of different shapes. Therefore, in these and other ways, the branch-like polysilicon layers can be modified into various shapes and angles to suit design requirements.

Fourth Preferred Embodiment

In the foregoing three exemplary embodiments, the middle trunk-like polysilicon layers and the upper trunk-like polysilicon layers are formed separately, and the branch-like polysilicon layers are attached to the lower surfaces of the upper trunk-like polysilicon layers. However, the invention is not limited to such a structure. In the following, a fourth exemplary embodiment, in which the middle and the upper trunk-like polysilicon layers are formed together in one piece, and the branch-like polysilicon layers are attached to the internal surfaces of the upper trunk-like polysilicon layers, is described.

Figure 5A:
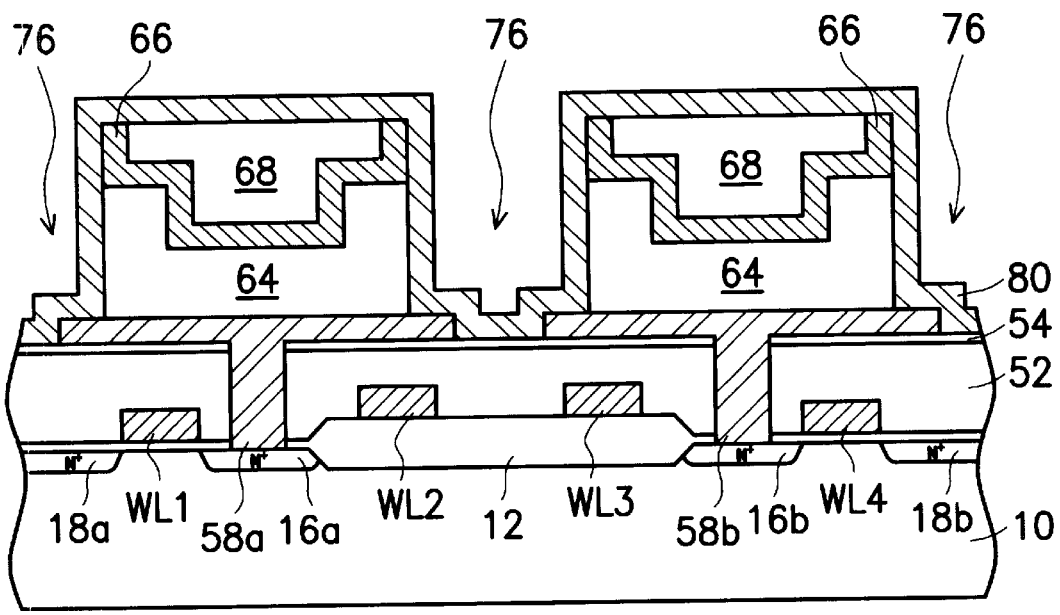
FIG. 5A through 5D are cross-sectional views for explaining a fourth embodiment of a method for fabricating a semiconductor memory device according to the invention.
Figure 5B:
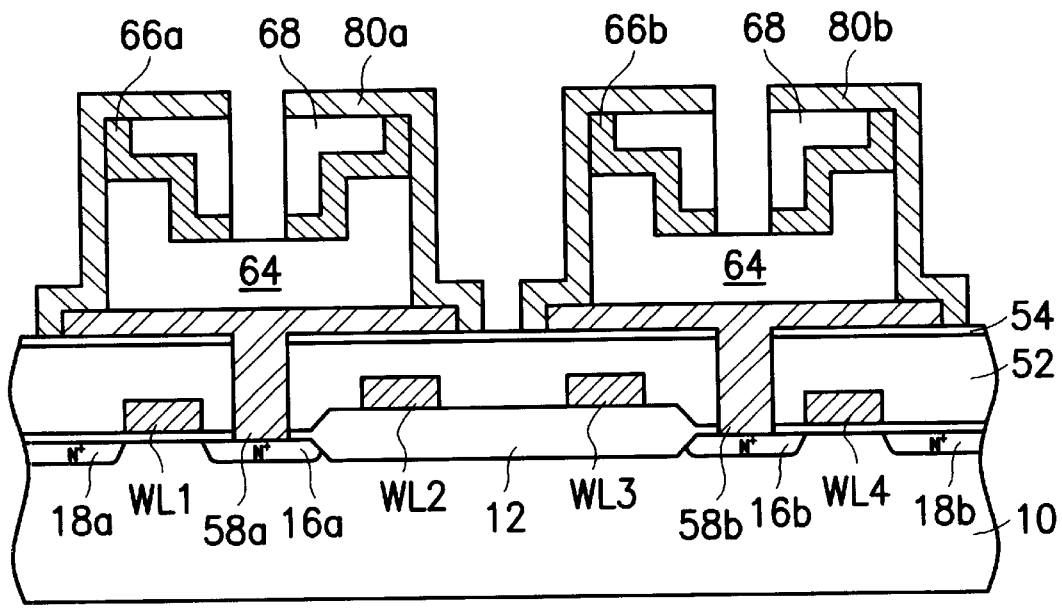
Figure 5C:
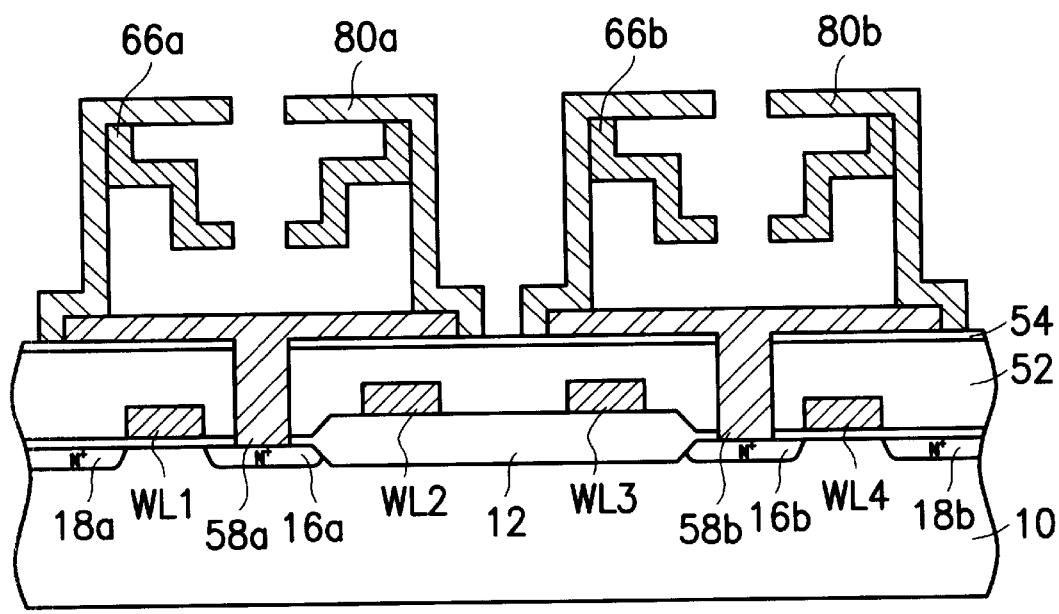
Figure 5D:
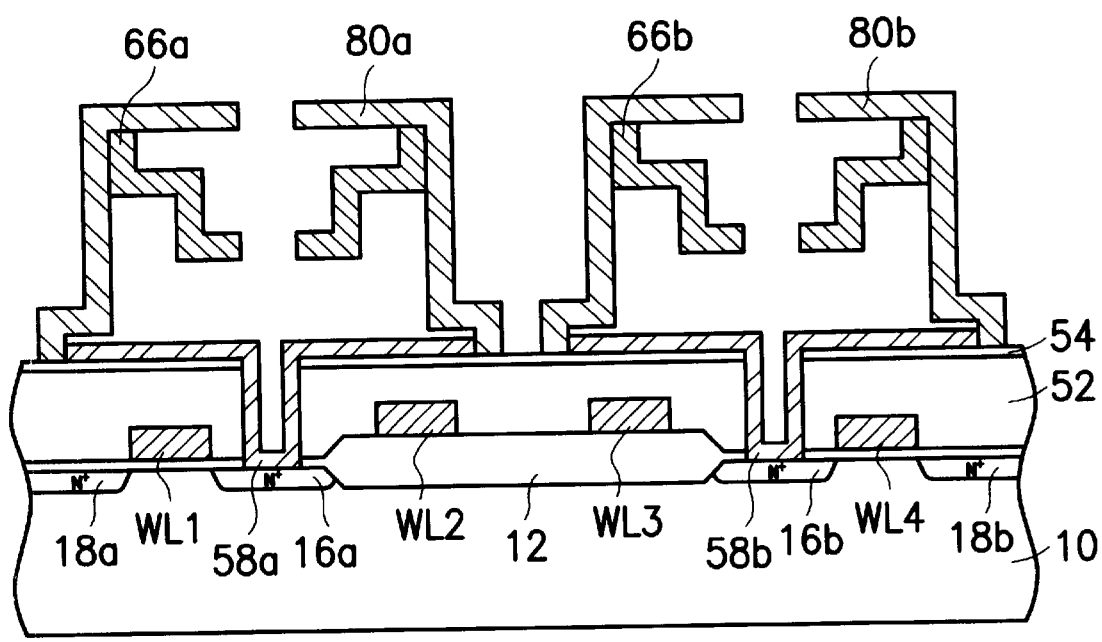

The description of the fourth embodiment of a semiconductor memory device having a tree-type charge storage capacitor produced according to the invention, is made by referring to FIGS. 5A through 5C. This embodiment of the semiconductor memory device is produced by a fourth preferred method for fabricating a semiconductor memory device according to the invention.

The tree-type storage electrode of the fourth embodiment is based on the structure of FIG. 4D. Elements in FIGS. 5A through 5C that are identical to those in FIG. 4D are therefore labeled with the same numerals.

Referring first to FIG. 5A together with FIG. 4D, after the fabrication process has reached the stage shown in FIG. 4D, conventional photolithographic and etching processes are used to etch the insulating pillar structure 64 until the surface of the etching protection layer 54 is reached. Thus, openings 76 are formed between the areas where adjacent charge storage capacitors are being formed. The sidewalls of the openings 76 are formed to be even with the outer edges of the polysilicon layers 66. Thereafter, the CVD method is used to deposit a polysilicon layer 80 to a thickness of approximately 1000 Å, for example. To increase the conductivity of polysilicon layer 80, arsenic ions, for example, can be implanted into the layer.

Referring next to FIG. 5B, in a subsequent step, in areas approximately above the drain regions 16a, 16b, and in the intermediate regions between the adjacent charge storage capacitors, conventional photolithographic and etching processes are carried out to selectively etch, the polysilicon layer 80, the insulating layer 68 and the polysilicon layer 66 and the pillar insulating layer 64. Through the above etching operations, polysilicon layers 80 and 66 are sliced into a number of sections, i.e., 80a, 80b and 66a, 66b.

Referring next to FIG. 5C, in a subsequent step, wet etching is performed with the etching protection layer 54 as the etch end point, to remove the exposed silicon dioxide layers, such as the remainder of the insulating layer 68 and insulating pillar 64. The fabrication of the storage electrodes of the charge storage capacitors for the DRAM thus is completed. As shown in FIG. 5C, the storage electrodes are made up of respective lower trunk-like polysilicon layers 58a, 58b; respective upper trunk-like polysilicon layers 80a, 80b; and respective branch-like polysilicon layers 66a, 66b having four segments with a zigzag shape in cross section (or a double L-shaped in cross section). The lower trunk-like polysilicon layers 58a, 58b are respectively electrically coupled to the drain regions 16a and 16b of the transfer transistors for the DRAM, and have a T-shaped cross section. The lower end of the upper trunk-like polysilicon layers 80a, 80b are connected to the respective periphery of the lower trunk-like polysilicon layers 58a and 58b, and extend substantially upright away from the substrate 10 for a certain length before extending horizontally inward parallel with the substrate 10 for a certain distance. The upper trunk-like polysilicon layers 80a, 80b may be generally of a hollow cap-like cylindrical shape, having an inverted L-shaped cross section, however their horizontal cross section (not shown) can be circular, rectangular or any other suitable shape that follows the shape of the insulating pillar 68. The first segments of the branch-like polysilicon layers 66a, 66b are tightly and securely attached to the inverted L-shaped corner of the upper trunk-like polysilicon layers 80a and 80b. Therefore, the branch-like polysilicon layers 66a and 66b can also be regarded as having only three segments with a Z-shaped cross section. The branch-like polysilicon layers 66a, 66b when regarded in this way extend from the internal surface of the upper trunk-like polysilicon layers 80a, 80b, first extending horizontally inward, then vertically down for a certain length before extending horizontally inward again. Subsequent processing steps, i.e., forming the dielectric and opposing electrode layers, do not differ in substance from the previously described processes, therefore these are not described again in detail herein.

Fifth Preferred Embodiment

In the foregoing first through fourth exemplary embodiments, the lower surface of the horizontal part of the lower trunk-like polysilicon layer is illustrated as touching the etching protection layer (22, 54), and also the CMP technique is used in the removal of the polysilicon layer above the insulating pillar (28). However, the invention is not necessarily limited to the above. In the following fifth exemplary preferred embodiment, the lower surface of the horizontal part of the lower trunk-like polysilicon layer is separated some distance from the etching protection layer below, to thereby increase the surface area of the storage electrode. Also, an alternative technique, such as using conventional photolithographic and etching processes, to cut away the polysilicon layer above the insulating pillar and thus form a different storage electrode structure, is described. Furthermore, in the foregoing first through third embodiments, the middle trunk-like polysilicon layers are formed as polysilicon sidewalls. However, the invention is also not limited to such structure. In the following fifth preferred embodiment, the middle trunk-like polysilicon layer formed by an alternative method is described.

A description will now be given of a fifth embodiment of a semiconductor memory device having a tree-type charge storage capacitor formed according to the invention, by referring to FIGS. 6A through 6D. This embodiment of the semiconductor memory device is produced by a fifth preferred exemplary method for fabricating a semiconductor memory device according to the invention.

The tree-type storage electrode of the fifth embodiment is based on the structure of FIG. 2A. Elements in FIGS. 6A through 6D that are identical to those in FIG. 2A are therefore labeled with the same numerals.

Figure 6A:
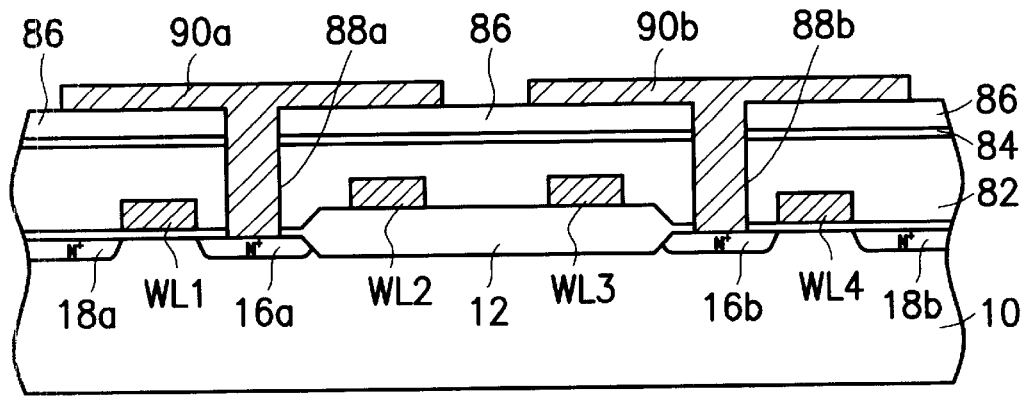
FIG. 6A through 6F are cross-sectional views for explaining a fifth embodiment of a method for fabricating a semiconductor memory device according to the invention.

Referring first to FIG. 6A together with FIG. 2A, the CVD method is used to sequentially deposit a planarization insulating layer 82, an etching protection layer 84 and an insulating layer 86. The planarization insulating layer 82, for example, can be a BPSG layer deposited to a thickness of approximately 7000 Å. The etching protection layer, for example, can be silicon nitride layer deposited to a thickness of approximately 1000 Å. The insulating layer 86, for example, can be a silicon dioxide layer deposited to a thickness of approximately 1000 Å. Thereafter, conventional photolithographic and etching processes are used to selectively etch, in sequence, the insulating layer 86, the etching protection layer 84, the planarization insulating layer 82, and the gate oxide layer 14. As a result, storage electrode contact holes 88a and 88b are formed. The storage electrode contact holes 88a and 88b extend respectively from a top surface of the insulating layer 86 to a top surface of the drain regions 16a and 16b. A polysilicon layer is then deposited on the surface of the insulating layer 86 and fills the storage electrode contact holes 88a and 88b. Again, conventional photolithographic and etching processes are used to define the polysilicon layers to form polysilicon layers 90a and 90b as shown in FIG. 6A, marking out the location for the storage electrode of the charge storage capacitor for each memory cell. To increase the conductivity of the polysilicon layers 90a, 90b, arsenic ions, for example, can be implanted into the layers. As shown in FIG. 6A, the polysilicon layer 90a fills up the storage electrode contact hole 88a and covers part of the surface of the insulating layer 86. Similarly, polysilicon layer 90b fills up the storage electrode contact hole 88b and covers part of the surface of the insulating layer 86.

Figure 6B:
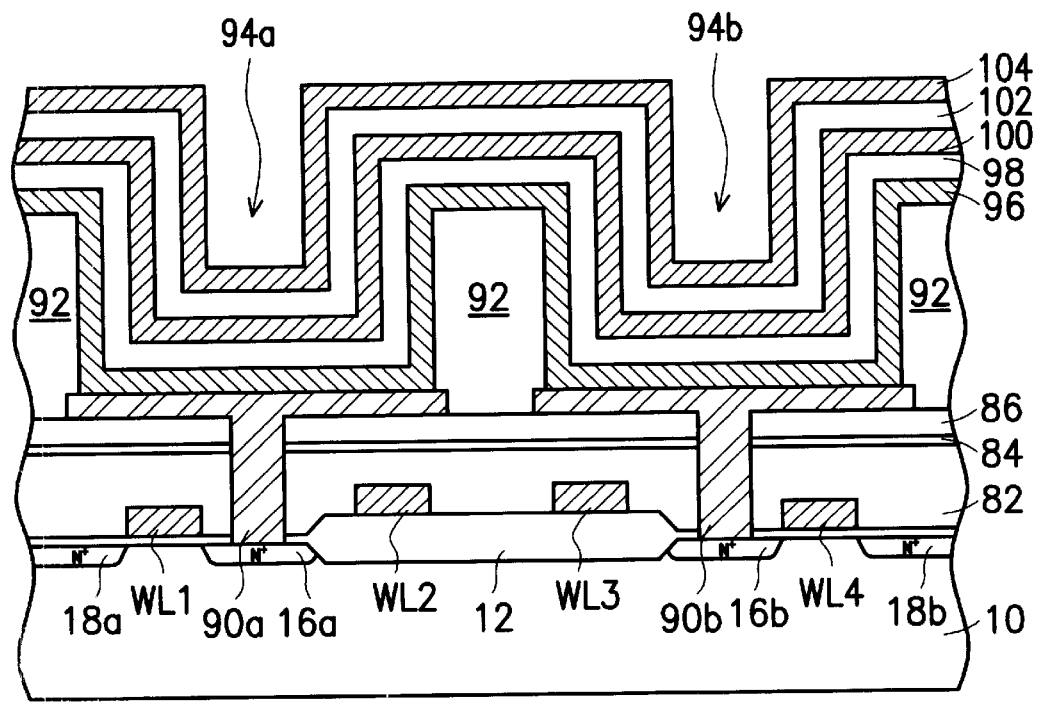

Referring next to FIG. 6B, in a subsequent step, a thick insulating layer of, for example, silicon dioxide is deposited to a thickness of approximately 7000 Å. Then, conventional photolithographic and etching processes are used to etch away selected parts of the insulating layer to form insulating pillars 92 as shown in the drawing. The insulating pillars 92 are bounded by a plurality of recesses 94a and 94b, and the centers of the recesses 94a and 94b are preferably located directly above the respective drain regions 16a and 16b. After that, the CVD method is used to form polysilicon layer 96, and alternatingly to form the insulating layers 98 and 102, and polysilicon layers 100 and 102. The layers thus formed are in sequence polysilicon layer 96, insulating layer 98, polysilicon layers 100, insulating layer 102, and polysilicon layer 104. The insulating layers 98 and 102, for example, can be silicon dioxide layers deposited to a thickness of approximately 1000 Å. The polysilicon layers 96, 100 and 104, for example, can be deposited to a thickness of approximately 1000 Å. To increase the conductivity of the polysilicon layers 96, 100, 104, arsenic ions, for example, can be implanted into the layers.

Figure 6C:
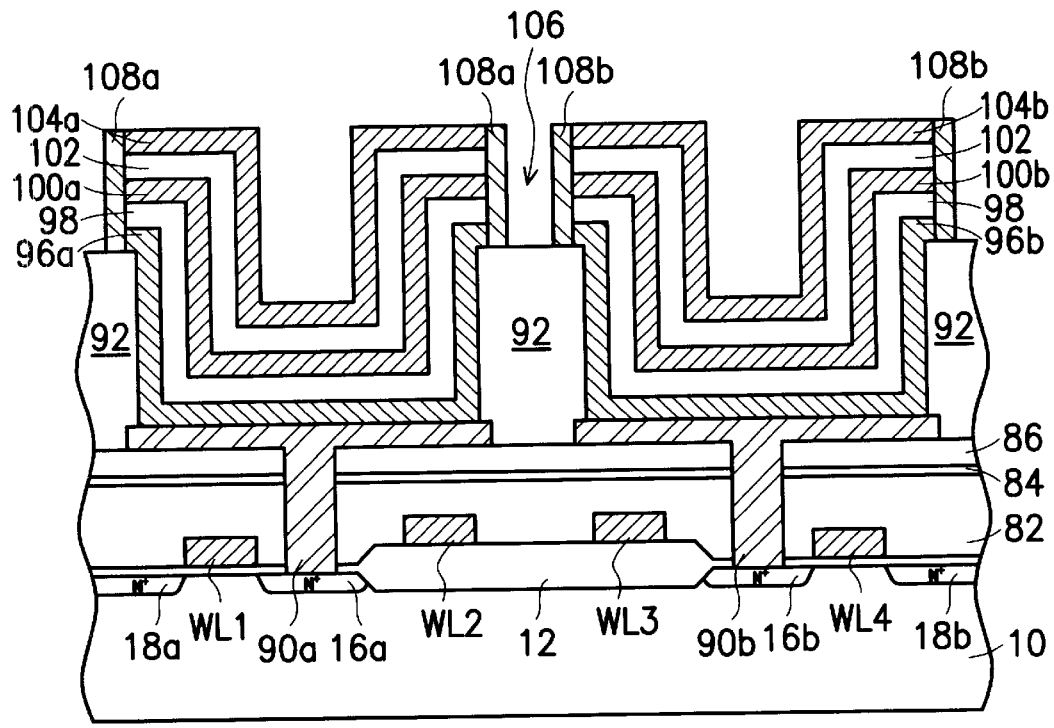

Referring next to FIG. 6C, in a subsequent step conventional photolithographic and etching processes are used to etch, in sequence, the polysilicon layer 104, the insulation layer 102, the polysilicon layer 100, the insulating layer 98 and polysilicon layer 96, to form a plurality of openings 106. The purpose of the openings 106 is to divide the polysilicon layers 104, 100 and 96 in the areas located above the insulating pillars 92 into sections, such as 104a, 104b; 100a, 100b; and 96a, 96b, to separate electrically one storage electrode from a neighboring one. Subsequently, polysilicon sidewall layers 108a and 108b are formed on the sidewalls of openings 106, to electrically couple and form single storage electrodes from respective polysilicon layers 104a, 100a, 96a and 104b, 100b, 96b. In this preferred embodiment, the sidewall polysilicon layers 108a and 108b can be formed by depositing a polysilicon layer to a thickness of approximately 1000 Å, for example, followed by an etching back process.

Figure 6D:
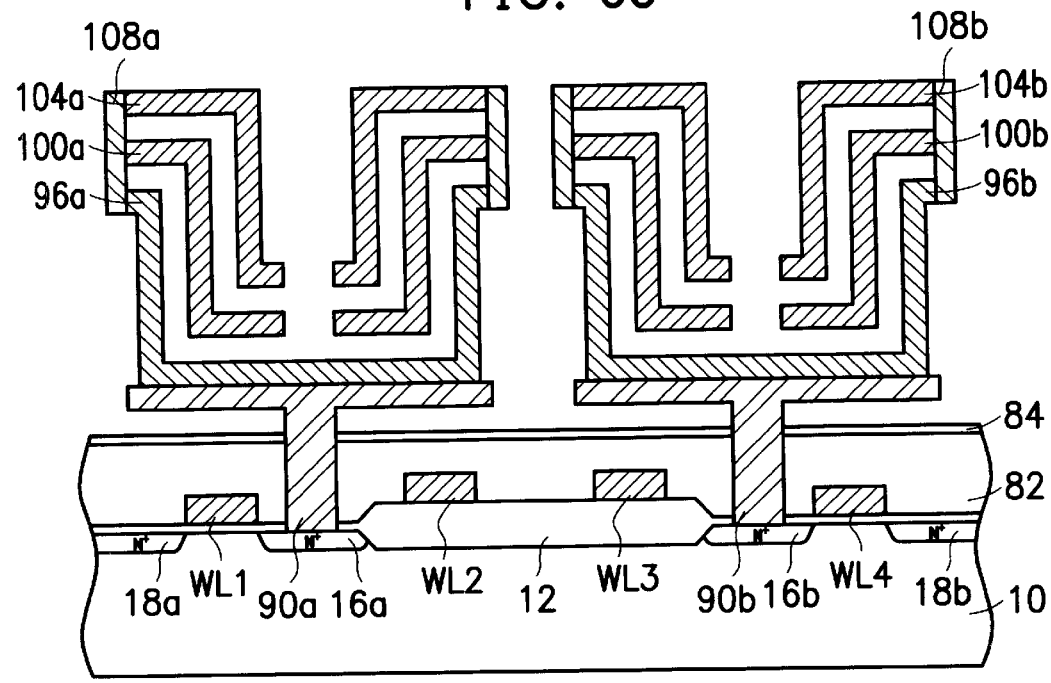
Figure 6E:
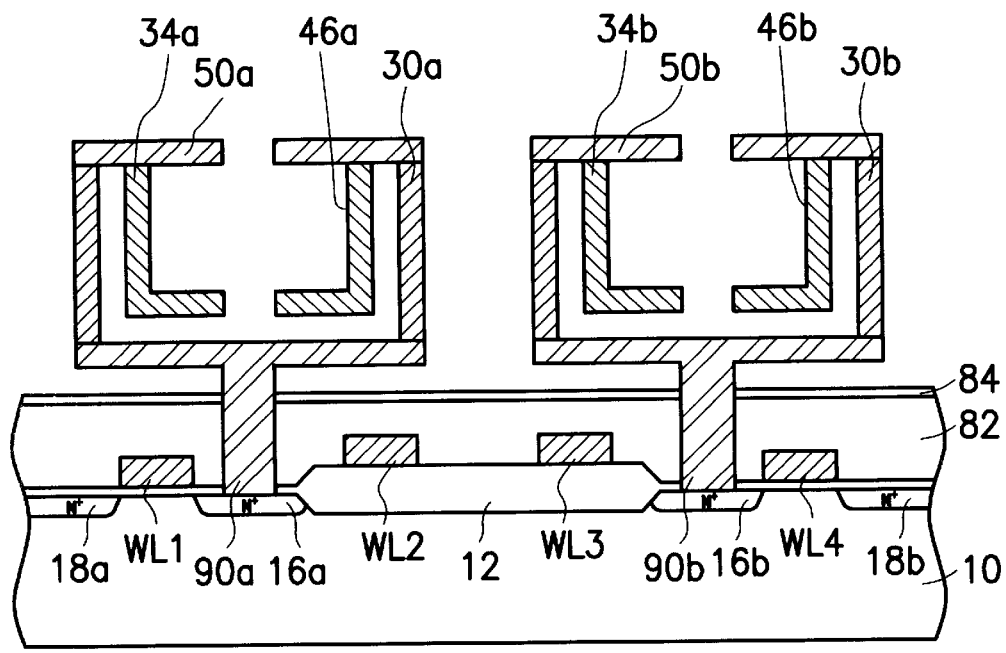
Figure 6F:
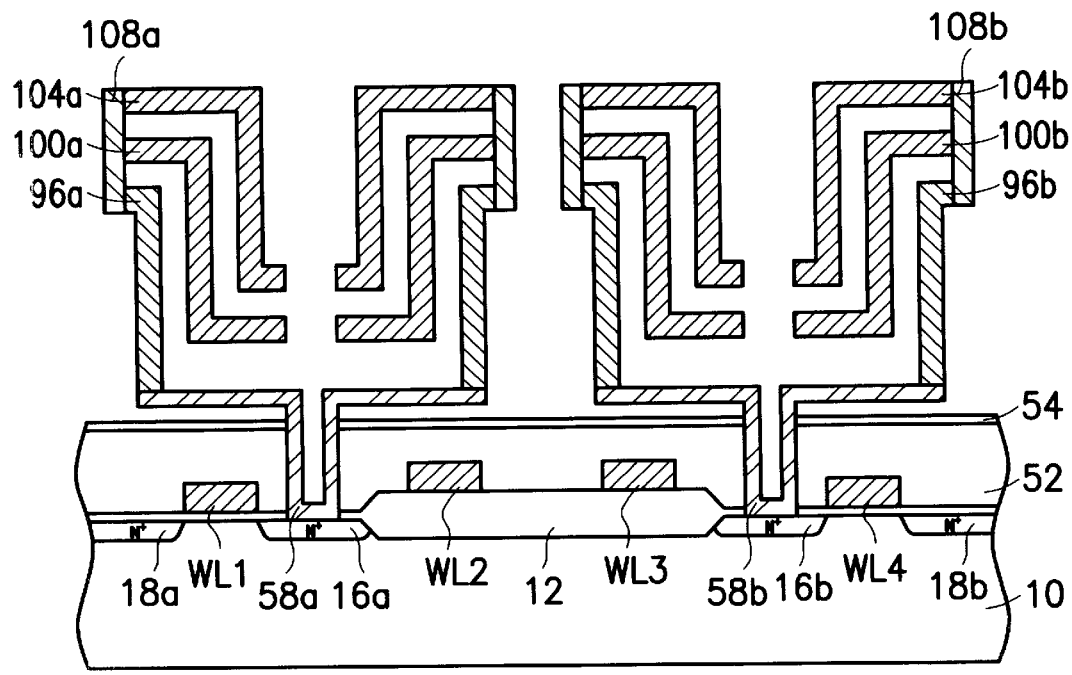

Referring next to FIG. 6D, in a subsequent step, in areas approximately above the drain regions 16a and 16b, conventional photolithographic and etching processes are then carried out to selectively etch, in sequence, first the polysilicon layers 104a and 104b, then the insulating layer 102, and finally the polysilicon layers 100a and 100b. Through the above etching operations, respective polysilicon layers 104a, 104band 100a, 100bare further divided into two respective sections. Lastly, wet etching is performed with the etching protection layer 84 as the etch end point, to remove the remaining exposed silicon dioxide layers, such as the insulating layers 102, 98, and 86, and the insulating pillar 92. The fabrication of the storage electrodes of the charge storage capacitors for the DRAM is thus completed.

As shown in FIG. 6D, the respective storage electrodes are made up of respective lower trunk-like polysilicon layers 90a, 90b; respective middle trunk-like polysilicon layers 96a, 96b; respective upper trunk-like polysilicon layers 108a, 108b; and two respective branch-like polysilicon layers 104a, 100a and 104b, 100b, with each branch having three segments forming a zigzag in cross section. The lower trunk-like polysilicon layers 90a, 90b are respectively electrically coupled to the drain regions 16a and 16b of the transfer transistors for the DRAM, and have a T-shaped cross section. The middle trunk-like polysilicon layers 96a, 96b have a U-shaped cross section. The respective lower surfaces, i.e., the respective bottom pieces of the U-shaped middle trunk-like polysilicon layers, are attached to the respective top surfaces of the lower trunk-like polysilicon layers 90a, 90b, and so could also be regarded as part of the lower trunk-like polysilicon layers 90a and 90b. The peripheral parts of the U-shaped middle trunk-like polysilicon layers connect with the top periphery of the lower trunk-like polysilicon layers 90a and 90b, and extend substantially upright away from the substrate 10. One end of the respective upper trunk-like polysilicon layers 108a, 108b is connected to the upper end of the respective middle trunk-like polysilicon layers 96a, 96b, and layers 108a, 108b extend substantially upright therefrom away from substrate 10. The middle trunk-like polysilicon layers 96a, 96b may be of a generally hollow cylindrical shape, however their horizontal cross section can be circular, rectangular or any other suitable shape. The respective two branch-like polysilicon layers 104a, 100a and 104b, 100b, extend respectively from the internal surfaces of the upper polysilicon layers 108a, 108b, first in a horizontal direction parallel to substrate 10 inward for a certain distance, then vertically down a certain length, and finally in a horizontal direction inward once again.

It will be apparent to those skilled in the art of semiconductor fabrication that the foregoing disclosed embodiments can be applied either alone or in combination to provide storage electrodes of various sizes and shapes on a single DRAM chip. These variations are all considered to be within the scope of the invention.

Although in the accompanying drawings the embodiments of the drains of the transfer transistors are based on diffusion areas in a silicon substrate, other variations, for example trench type drain regions, are possible within the spirit of the invention.

Elements in the accompanying drawings are schematic diagrams for demonstrative purpose only and therefore are not depicted in the actual scale. The shapes, dimensions and extension angles of the elements of the invention as shown should not be considered limitations on the scope of the invention.

While the invention has been described by way of examples and in terms of the preferred embodiments, it is to be understood that the invention is not limited to the disclosed embodiments. To the contrary, the invention is intended to cover various modifications and similar arrangements and processes as would be apparent to those skilled in the art. Therefore, the scope of the appended claims, which define the invention, should be accorded the broadest interpretation so as to encompass all such modifications and similar arrangements and processes.

What is claimed is:

1. A method of fabricating a storage capacitor electrode structure for use in a semiconductor memory cell including a transfer transistor formed on a substrate, the method comprising:

forming a first insulating layer over the transfer transistor;

forming a first conducting layer which penetrates the first insulating layer and contacts a source/drain region of the transfer transistor;

forming a pillar layer extending above the first insulating layer, the pillar layer having a recess disposed above the first conducting layer, the recess having a sidewall;

forming a second conducting layer along the sidewall of the recess and in contact with the first conducting layer;

forming a second insulating layer on the first conducting layer, the second conducting layer and the pillar layer;

forming a third conducting layer on the second insulating layer;

forming a third insulating layer on the third conducting layer;

removing selective portions of the third insulating layer, the third conducting layer, and the second insulating layer to form a surface at the pillar layer level;

forming a fourth conducting layer on the surface at the pillar layer level; and removing portions of the fourth conducting layer and the third conducting layer, and removing entirely the third insulating layer, the second insulating layer, and the pillar layer;

wherein the storage capacitor electrode structure includes the first, second, third and fourth conducting layers.

2. The method according to claim 1, wherein the step of forming the first conducting layer comprises:

forming an electrode contact hole in the first insulating layer down to the source/drain region of the transfer transistor;

forming a layer of conducting material on the first insulating layer and filling the contact hole; and removing selective portions of the layer of conducting material from the first insulating layer surface;

wherein the first conducting layer has a T-shape in cross section.

3. The method according to claim 1, wherein the step of forming the first conducting layer comprises:

forming an electrode contact hole in the first insulating layer down to the source/drain region of the transfer transistor, the contact hole having a sidewall;

forming a layer of conducting material on the first insulating layer and filling the contact hole; and removing selective portions of the layer of conducting material from the first insulating surface and from within the contact hole leaving the contact hole sidewall coated with the conducting material and the source/drain region contacting the conducting material;

wherein the first conducting layer has a U-shape in cross section.

4. The method according to claim 1, further comprising:

forming a dielectric layer covering the first, second, third and fourth conducting layers.

5. A method of forming a storage capacitor having the storage capacitor electrode structure formed according to claim 4, further comprising:

forming a fifth conducting layer on the dielectric layer;

wherein the fifth conducting layer forms an opposing electrode of the storage capacitor.

6. The method according to claim 1, wherein:

after the step of forming the third insulating layer on the third conducting layer, the method further comprising:

forming above the third insulating layer at least once in sequence, at least one additional conducting layer, and at least one additional insulating layer on the at least one additional conducting layer; and removing selective portions of the at least one additional conducting and insulating layers to the level of the surface at the pillar layer level; and after the step of forming a fourth conducting layer on the surface at the pillar layer level, the method further comprising:

removing portions of the at least one additional conducting layer; and removing completely the at least one additional insulating layer;

wherein the storage capacitor electrode structure further includes the at least one additional conducting layer.

7. The method according to claim 6, further comprising:

forming a dielectric layer covering the first, second, third, fourth and at least one additional conducting layers.

8. A method of forming a storage capacitor having the storage capacitor electrode structure formed according to claim 7, further comprising:

forming a fifth conducting layer on the dielectric layer;

wherein the fifth conducting layer forms an opposing electrode of the storage capacitor.

9. The method according to claim 6, wherein the step of forming the first conducting layer comprises:

forming an electrode contact hole in the first insulating layer down to the source/drain region of the transfer transistor;

forming a layer of conducting material on the first insulating layer and filling the contact hole; and removing selective portions of the layer of conducting material from the first insulating layer surface;

wherein the first conducting layer has a T-shape in cross section.

10. The method according to claim 6, wherein the step of forming the first conducting layer comprises:

forming an electrode contact hole in the first insulating layer down to the source/drain region of the transfer transistor, the contact hole having a sidewall;

forming a layer of conducting material on the first insulating layer and filling the contact hole; and removing selective portions of the layer of conducting material from the first insulating surface and from within the contact hole leaving the contact hole sidewall coated with the conducting material and the source/drain region contacting the conducting material;

wherein the first conducting layer has a U-shape in cross section.

11. A method of fabricating a storage capacitor electrode structure for use in a semiconductor memory cell including a transfer transistor formed on a substrate, the method comprising:

forming a first insulating layer over the transfer transistor;

forming a first conducting layer which penetrates the first insulating layer and contacts a source/drain region of the transfer transistor;

forming a pillar layer extending above the first insulating layer, the pillar layer having a recess exposing the first conducting layer, the recess having a sidewall;

forming a second conducting layer covering the first conducting layer and the pillar layer including the sidewall of the recess, and in contact with the first conducting layer;

forming a second insulating layer on the second conducting layer;

forming a third conducting layer on the second insulating layer;

forming an opening having a sidewall by removing selective portions of the third conducting layer, the second insulating layer, and the second conducting layer to expose a surface of the pillar layer;

forming a fourth conducting layer on the opening sidewall and in contact with the second and third conducting layers; and removing portions of the third conducting layer and the second conducting layer, and removing entirely the second insulating layer and the pillar layer;

wherein the storage capacitor electrode structure includes the first, second, third and fourth conducting layers.

12. The method according to claim 11, wherein the step of forming the first conducting layer comprises:

forming an electrode contact hole in the first insulating layer down to the source/drain region of the transfer transistor;

forming a layer of conducting material on the first insulating layer and filling the contact hole; and removing selective portions of the layer of conducting material from the first insulating layer surface;

wherein the first conducting layer has a T-shape in cross section.

13. The method according to claim 11, wherein the step of forming the first conducting layer comprises:

forming an electrode contact hole in the first insulating layer down to the source/drain region of the transfer transistor, the contact hole having a sidewall;

forming a layer of conducting material on the first insulating layer and filling the contact hole; and removing selective portions of the layer of conducting material from the first insulating surface and from within the contact hole leaving the contact hole sidewall coated with the conducting material and the source/drain region contacting the conducting material;

wherein the first conducting layer has a U-shape in cross section.

14. The method according to claim 11, further comprising: forming a dielectric layer covering the first, second and third conducting layers.

15. A method of forming a storage capacitor having the storage capacitor electrode structure formed according to claim 14, further comprising:

forming a further conducting layer on the dielectric layer;

wherein the further conducting layer forms an opposing electrode of the storage capacitor.

16. The method according to claim 1, wherein, after the step of forming a first insulating layer over the transfer transistor, the method further comprises forming an additional insulating layer above the first insulating layer;

wherein, in the step of forming a first conducting layer which penetrates the first insulating layer and contacts a source/drain region of the transfer transistor, the first conducting layer also penetrates the additional insulating layer; and wherein the step of removing portions of the fourth conducting layer and the third conducting layer, and removing entirely the third insulating layer, the second insulating layer, and the pillar layer, comprises also removing completely the additional insulating layer;

wherein the first conducting layer is separated from the first insulating layer due to the removal of the additional insulating layer.

17. The method according to claim 16, further comprising:

forming a dielectric layer covering the first, second and third conducting layers.

18. A method of forming a storage capacitor having the storage capacitor electrode structure formed according to claim 17, further comprising:

forming a further conducting layer on the dielectric layer;

wherein the further conducting layer forms an opposing electrode of the storage capacitor.

19. The method according to claim 1, wherein:

the first conducting layer is substantially T-shaped in cross section, the bottom of the T-shape contacting the source/drain region of the transfer transistor;

the second conducting layer extends substantially perpendicularly from the periphery of the top of the T-shaped first conducting layer away from the substrate;

the third conducting layer extends from an end of the second conducting layer substantially perpendicular thereto, the second conducting layer and the third conducting layer together forming an inverted L-shape in cross section; and the fourth conducting layer has a first segment which extends perpendicularly from a bottom surface of the third conducting layer toward the substrate, and has a second segment which extends perpendicularly from the first segment away from the second conducting layer, the first and second segments forming an L-shape in cross section.

20. The method according to claim 10, wherein:

the second conducting layer extends substantially perpendicularly from the periphery of the top of the U-shaped first conducting layer away from the substrate;

the third conducting layer extends from an end of the second conducting layer substantially perpendicular thereto, the second conducting layer and the third conducting layer together forming an inverted L-shape in cross section; and the fourth conducting layer has a first segment which extends perpendicularly from a bottom surface of the third conducting layer toward the substrate, and has a second segment which extends perpendicularly from the first segment away from the second conducting layer, the first and second segments forming an L-shape in cross section.

* * * * *